(12) United States Patent
Mochizuki et al.

(10) Patent No.: US 11,531,221 B2
(45) Date of Patent: Dec. 20, 2022

(54) SUBSTRATE AND DISPLAY DEVICE

(71) Applicant: Japan Display Inc., Tokyo (JP)

(72) Inventors: Kazuhide Mochizuki, Tokyo (JP); Makoto Uchida, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/321,681

(22) Filed: May 17, 2021

(65) Prior Publication Data
US 2021/0356787 A1 Nov. 18, 2021

(30) Foreign Application Priority Data

May 18, 2020 (JP) .............................. JP2020-086611

(51) Int. Cl.
| | | |
|---|---|---|
| *G02F 1/133* | (2006.01) | |
| *H01L 27/146* | (2006.01) | |
| *G02F 1/1362* | (2006.01) | |
| *G06F 3/041* | (2006.01) | |
| *G02F 1/1339* | (2006.01) | |
| *G02F 1/1333* | (2006.01) | |
| *G02F 1/1368* | (2006.01) | |
| *G02F 1/1335* | (2006.01) | |
| *G02F 1/1343* | (2006.01) | |
| *G06F 3/044* | (2006.01) | |
| *G06V 40/13* | (2022.01) | |

(52) U.S. Cl.
CPC ...... *G02F 1/13312* (2021.01); *G02F 1/13338* (2013.01); *G02F 1/13394* (2013.01); *G02F 1/136209* (2013.01); *G02F 1/136295* (2021.01); *H01L 27/14623* (2013.01); *H01L 27/14627* (2013.01); *H01L 27/14678* (2013.01); *G02F 1/13685* (2021.01); *G02F 1/133514* (2013.01); *G02F 1/134336* (2013.01); *G02F 1/134363* (2013.01); *G02F 2202/101* (2013.01); *G06F 3/044* (2013.01); *G06F 3/0412* (2013.01); *G06F 3/04164* (2019.05); *G06F 3/04166* (2019.05); *G06V 40/1318* (2022.01); *H01L 27/14649* (2013.01)

(58) Field of Classification Search
CPC ............. G02F 1/13312; G02F 1/13318; G02F 1/136286; G02F 1/13685; G02F 1/136209; H01L 27/14643; H01L 27/14678; G06F 3/04164; G06F 3/0412; G06F 3/0443
See application file for complete search history.

(56) References Cited

U.S. PATENT DOCUMENTS

2006/0279690 A1    12/2006  Yu et al.
2014/0061739 A1*   3/2014   Kurokawa ............. H04N 1/195
                                                          257/292

FOREIGN PATENT DOCUMENTS

JP          2006-343713 A      12/2006

* cited by examiner

*Primary Examiner* — Angela K Davison
(74) *Attorney, Agent, or Firm* — Maier & Maier, PLLC

(57) ABSTRACT

According to one embodiment, a display device includes a first substrate and a second substrate. The first substrate includes a first switching element, a second switching element, a first organic insulating layer, a second organic insulating layer, a third organic insulating layer, a first connection electrode electrically connected to the first switching element, a second connection electrode electrically connected to the first connection electrode, a pixel electrode electrically connected to the second connection electrode, and a photoelectric conversion element electrically connected to the second switching element.

8 Claims, 18 Drawing Sheets

SUBSTRATE AND DISPLAY DEVICE

CROSS-REFERENCE TO RELATED APPLICATIONS

This application is based upon and claims the benefit of priority from Japanese Patent Application No. 2020-086611, filed May 18, 2020, the entire contents of which are incorporated herein by reference.

FIELD

Embodiments described herein relate generally to a substrate and a display device.

BACKGROUND

Recently, display devices of various shapes have been proposed. In one example, a display device including an element capable of sensing an object in a liquid crystal display device having a display function of displaying an image has been known.

DETAILED DESCRIPTION

Figure 1:
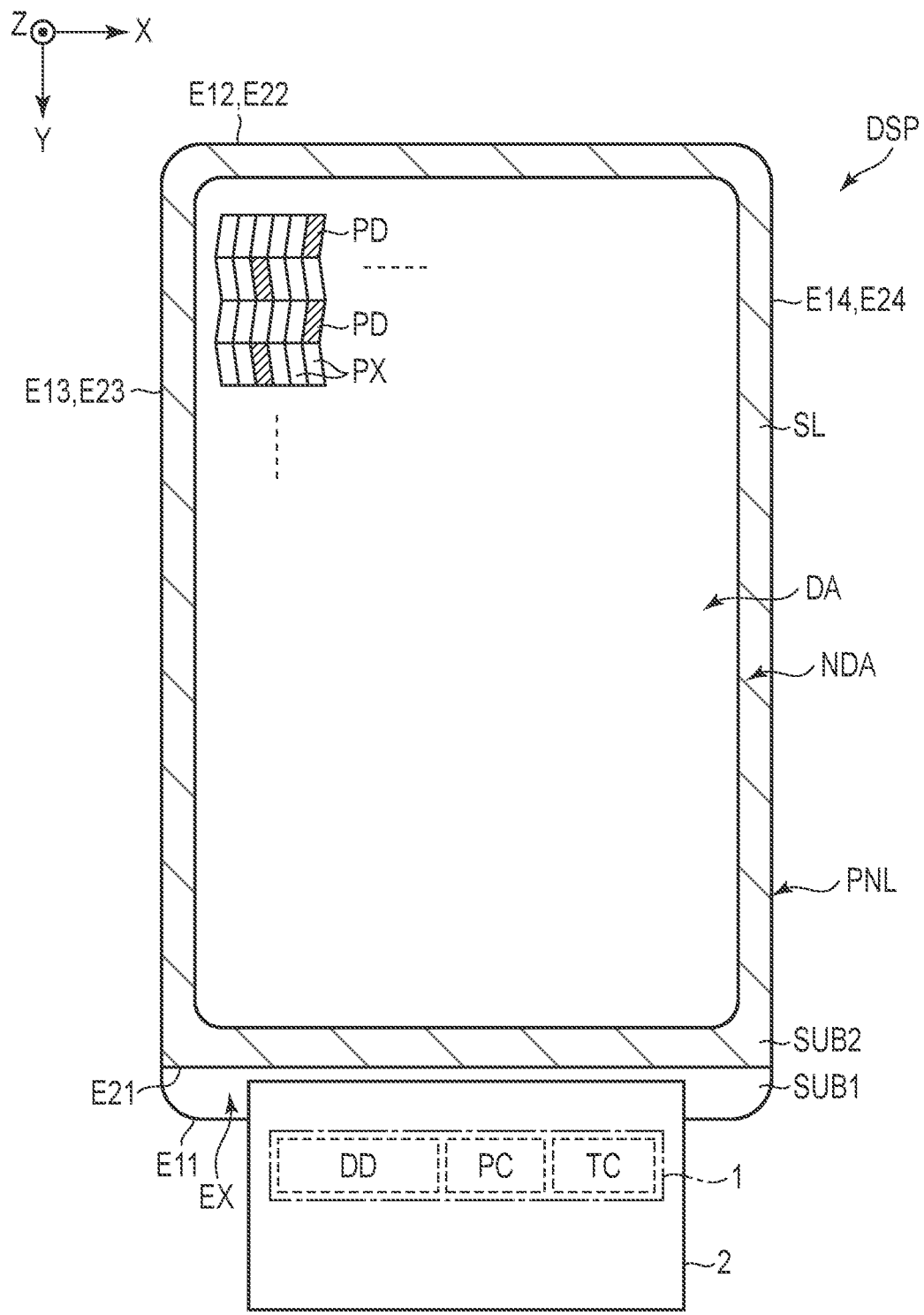
FIG. 1 is a plan view showing the external appearance of a display device of one embodiment.

In general, according to one embodiment, there is provided a display device comprising a first substrate and a second substrate opposed to the first substrate. The first substrate includes: a first switching element and a second switching element; a first organic insulating layer located above the first switching element and the second switching element; a third organic insulating layer located above the first organic insulating layer; a second organic insulating layer located between the first organic insulating layer and the third organic insulating layer; a first connection electrode located between the first organic insulating layer and the second organic insulating layer and electrically connected to the first switching element; a second connection electrode located between the second organic insulating layer and the third organic insulating layer and electrically connected to the first connection electrode; a pixel electrode located above the third organic insulating layer and electrically connected to the second connection electrode; and a photoelectric conversion element located between the first organic insulating layer and the second organic insulating layer and electrically connected to the second switching element.

According to another embodiment, there is provided a substrate comprising: a first switching element; a second switching element; a first organic insulating layer located above the first switching element and the second switching element; a pixel electrode located above the first organic insulating layer and electrically connected to the first switching element; and a photoelectric conversion element located between the pixel electrode and the first organic insulating layer and electrically connected to the second switching element.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed explanations of them that are considered redundant are omitted unless otherwise necessary.

FIG. 1 is a plan view showing the external appearance of a display device DSP of one embodiment. In one example, a first direction X, a second direction Y and a third direction Z are orthogonal to one another. However, they may cross one another at an angle other than 90 degrees. The first direction X and the second direction Y correspond to directions parallel to the main surface of a substrate constituting the display device DSP, and the third direction Z corresponds to the thickness direction of the display device DSP. In the specification, a direction toward the point of an arrow indicating the third direction Z is referred to as upward (or simply above), and a direction from the point of the arrow to the opposite side is referred to as downward (or simply below). In addition, an observation position from which the display device DSP is observed is assumed to be located on a side on which the point of the arrow indicating the third direction Z is located, and viewing from this observation position toward an X-Y plane defined by the first direction X and the second direction Y is referred to as planar view. A plan view of the display device DSP in the X-Y plane is illustrated here.

As shown in FIG. 1, the display device DSP comprises a display panel PNL, an integrated circuit 1 and a wiring substrate 2. The display panel PNL is, for example, a liquid crystal panel, and comprises a first substrate SUB1, a second substrate SUB2, a liquid crystal layer (liquid crystal layer LC which will be described later) and a sealant SL. The first substrate SUB1 and the second substrate SUB2 are opposed to each other in the third direction Z, and are bonded together by the sealant SL.

The display device DSP comprises a display portion DA in which an image is displayed, and a non-display portion NDA around the display portion DA. The non-display portion NDA is formed in a frame shape. The sealant SL is located in the non-display portion NDA. A plurality of pixels PX and a plurality of photoelectric conversion elements PD arranged in a matrix in the first direction X and the second direction Y are disposed in the display portion DA. The photoelectric conversion elements PD are shaded with upward-sloping lines. The display portion DA has four sides and four round portions connecting the respective sides. The display portion DA is located inside the sealant SL in planar view. In FIG. 1, the sealant SL is shaded with downward-sloping lines.

The first substrate SUB1 comprises an end portion E11 and an end portion E12 which extend in the first direction X, and an end portion E13 and an end portion E14 which extend in the second direction Y. The second substrate SUB2 comprises an end portion E21 and an end portion E22 which extend in the first direction X, and an end portion E23 and an end portion E24 which extend in the second direction Y. In the illustrated example, the end portion E12 and the end portion E22, the end portion E13 and the end portion E23, and the end portion E14 and the end portion E24 overlap each other. However, they may not overlap each other. The end portion E21 is located between the end portion E11 and the display portion DA. The first substrate SUB1 has an extension portion EX between the end portion E11 and the end portion E21. The extension portion EX is a single-layer part of the display panel PNL in which the first substrate SUB1 is exposed from the second substrate SUB2.

The integrated circuit 1 and the wiring substrate 2 may read a signal from the display panel PNL but mainly function as a signal source which supplies a signal to the display panel PNL. The wiring substrate 2 is mounted on the extension portion EX. The integrated circuit 1 is mounted on the wiring substrate 2, and is electrically connected to the wiring substrate 2. Note that the integrated circuit 1 may be mounted on the extension portion EX and be electrically connected to the extension portion EX. The integrated circuit 1 includes a display driver DD which outputs a signal required for image display in a display mode in which an image is displayed. In addition, the integrated circuit 1 includes a touch controller TC which controls a touch sensing mode in which the approach or contact of an object to or with the display device DSP is detected. Furthermore, the integrated circuit 1 includes a photodetection controller PC which controls a photosensing mode in which light emitted from a light source and reflected by an object to be detected is detected.

The description of the detailed configuration of the display panel PNL is omitted here. However, the display panel PNL may have a configuration corresponding to any of a display mode using a lateral electric field along the main surface of a substrate, a display mode using a longitudinal electric field along the normal to the main surface of a substrate, and a display mode using an inclined electric field inclined in an oblique direction with respect to the main surface of a substrate, and a display mode using an arbitrary combination of the lateral electric field, the longitudinal electric field and the inclined electric field described above. The main surface of the substrate here means a surface parallel to the X-Y plane defined by the first direction X and the second direction Y.

Figure 2:
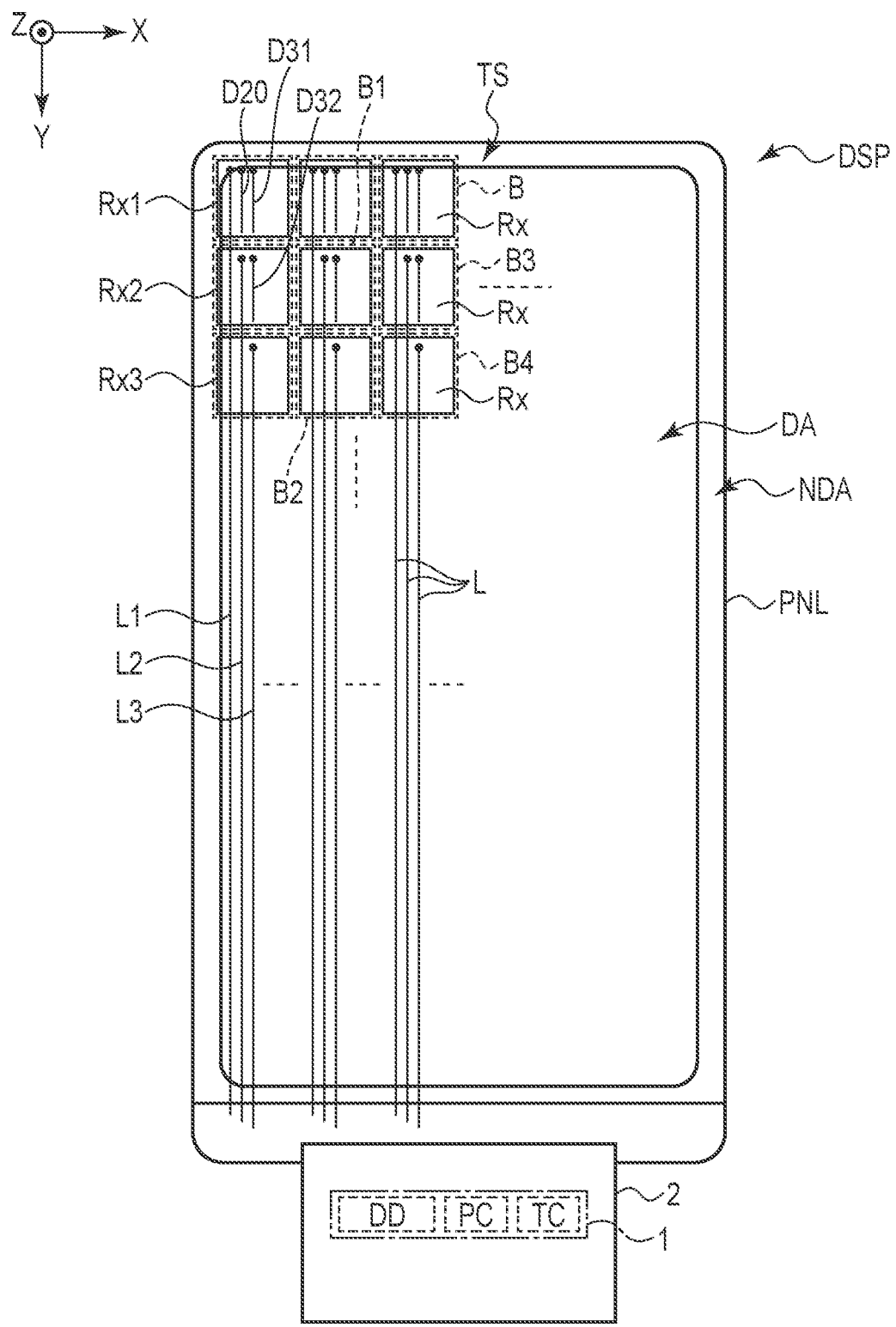
FIG. 2 is a plan view showing a configuration example of a touch sensor.

FIG. 2 is a plan view showing a configuration example of a touch sensor TS. The touch sensor TS of a self-capacitive type is described here, but the touch sensor TS may be of a mutual-capacitive type.

As shown in FIG. 2, the touch sensor TS comprises a plurality of sensor electrodes Rx (Rx1, Rx2, etc.) and a plurality of sensor lines L (L1, L2, etc.). The sensor electrodes Rx are located in the display portion DA, and are arranged in a matrix in the first direction X and the second direction Y. One sensor electrode Rx constitutes one sensor block B. The sensor block B is a minimum unit which can perform touch sensing. The sensor lines L each extend along the second direction Y and are arranged in the first direction X in the display portion DA. The sensor lines L are disposed at, for example, positions overlapping signal lines S which will be described later, respectively. In addition, the sensor lines L each are drawn to the non-display portion NDA and are electrically connected to the integrated circuit 1 via the wiring substrate 2.

Here, attention is focused on the relationship between the sensor lines L1 to L3 arranged in the first direction X and the sensor electrodes Rx1 to Rx3 arranged in the second direction Y. The sensor line L1 overlaps the sensor electrodes Rx1 to Rx3 and is electrically connected to the sensor electrode Rx1.

The sensor line L2 overlaps the sensor electrode Rx2 and the sensor electrode Rx3 and is electrically connected to the sensor electrode Rx2. In the illustrated example, the sensor line L2 does not extend between the sensor electrode Rx1 and the sensor electrode Rx2. However, it may extend between the sensor electrode Rx1 and the sensor electrode Rx2. A dummy line D20 is apart from the sensor line L2. The dummy line D20 overlaps the sensor electrode Rx1 and is electrically connected to the sensor electrode Rx1. The sensor line L2 and the dummy line D20 are located on the same signal line.

The sensor line L3 overlaps the sensor electrode Rx3 and is electrically connected to the sensor electrode Rx3. In the illustrated example, the sensor line L3 does not extend between the sensor electrode Rx2 and the sensor electrode Rx3. However, it may extend between the sensor electrode Rx2 and the sensor electrode Rx3. A dummy line D31 overlaps the sensor electrode Rx1 and is electrically connected to the sensor electrode Rx1. A dummy line D32 is apart from the dummy line D31 and the sensor line L3. The dummy line D32 overlaps the sensor electrode Rx2 and is electrically connected to the sensor electrode Rx2. The sensor line L3, the dummy line D31 and the dummy line D32 are located on the same signal line.

In the touch sensing mode, the touch controller TC applies a touch drive voltage to the sensor lines L. Accordingly, the touch drive voltage is applied to the sensor electrodes Rx, and sensing in the sensor electrodes Rx is performed. Sensor signals corresponding to the sensing results in the sensor electrodes Rx are output to the touch controller TC via the sensor lines L. The touch controller TC or an external host detects whether an object has approached or contacted the display device DSP or not and the position coordinates of the object based on the sensor signals.

In the display mode, the sensor electrodes Rx function as a common electrode CE to which a common voltage (Vcom) is applied. The common voltage is applied from, for example, a voltage supplier included in the display driver DD via the sensor lines L.

Figure 3:
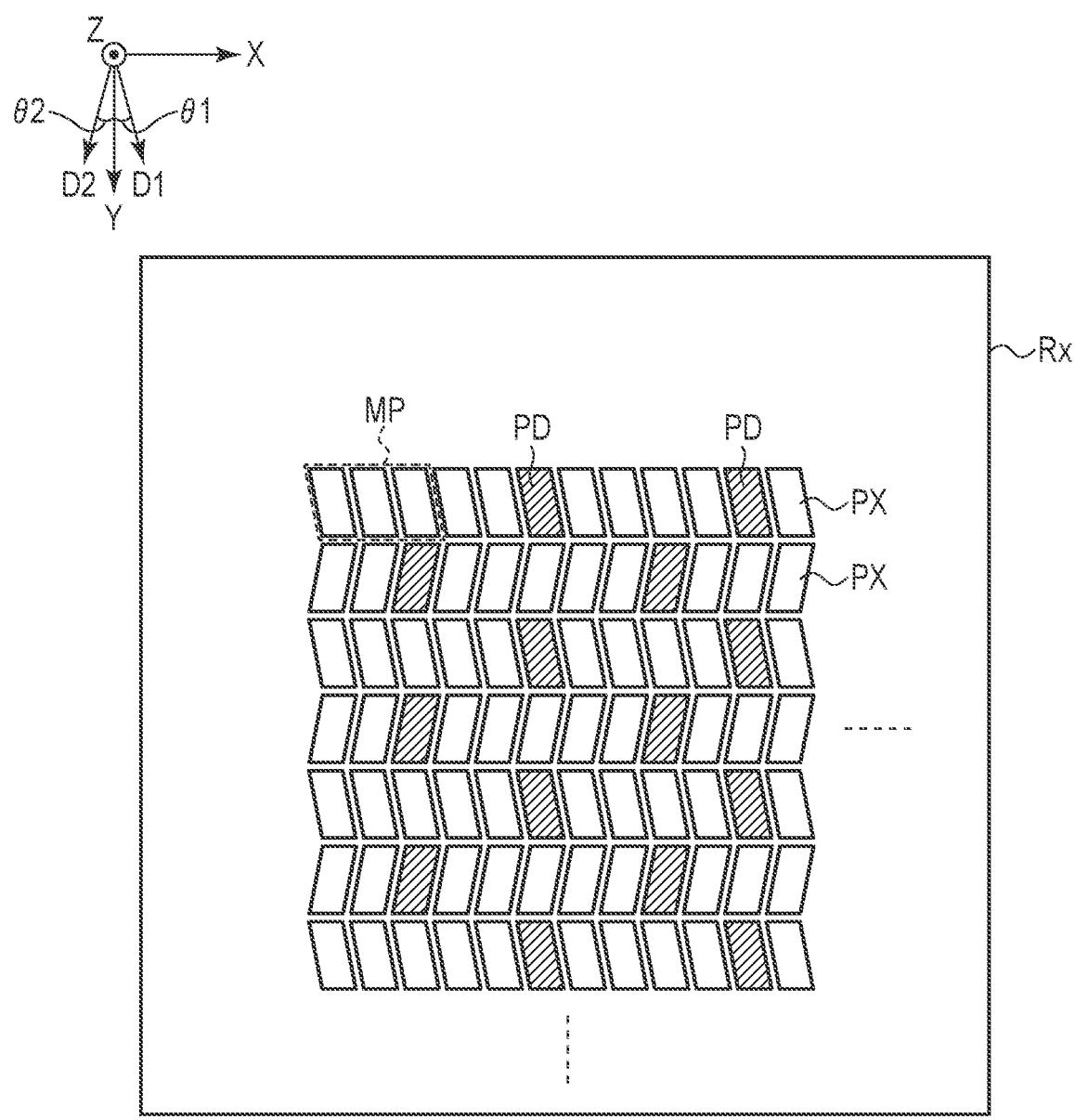
FIG. 3 is a plan view showing pixels and photoelectric conversion elements shown in FIG. 1 and a sensor electrode shown in FIG. 2.

FIG. 3 is a plan view showing the pixels PX and the photoelectric conversion elements PD shown in FIG. 1 and the sensor electrode Rx shown in FIG. 2. In FIG. 3, a direction crossing at an acute angle counterclockwise with respect to the second direction Y is defined as a direction D1, and a direction crossing at an acute angle clockwise with respect to the second direction Y is defined as a direction D2. An angle θ1 between the second direction Y and the direction D1 is substantially the same as an angle θ2 between the second direction Y and the direction D2.

As shown in FIG. 3, one sensor electrode Rx is disposed over a plurality of pixels PX and a plurality of photoelectric conversion elements PD. In the illustrated example, the pixels PX and the photoelectric conversion elements PD located in odd-numbered rows in the second direction Y extend in the direction D1. In addition, the pixels PX and the photoelectric conversion elements PD located in even-numbered rows in the second direction Y extend in the direction D2. The pixel PX here indicates a minimum unit which can be individually controlled according to a pixel signal, and may be referred to as a sub-pixel. In addition, a minimum unit for realizing color display may be referred to as a main pixel MP. The main pixel MP is composed of a plurality of sub-pixels PX which display different colors. In one example, the main pixel MP comprises a red pixel which displays red, a green pixel which displays green, and a blue pixel which displays blue as the sub-pixels PX.

In one example, in one sensor electrode Rx, 60 to 70 main pixels MP are disposed in the first direction X, and 60 to 70 main pixels MP are disposed in the second direction Y.

Figure 4:
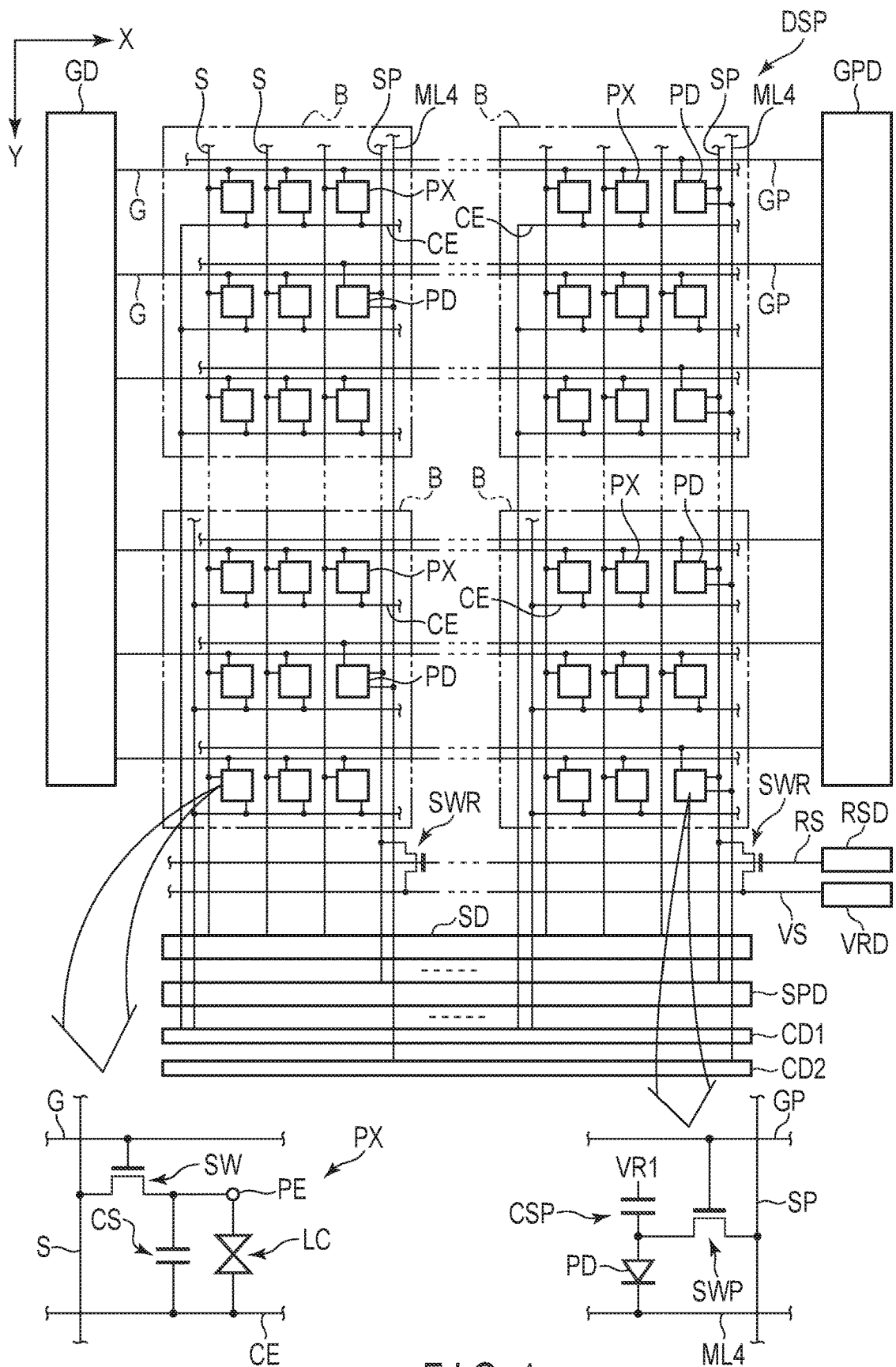
FIG. 4 is a circuit diagram showing the circuit of the display device shown in FIG. 1.

FIG. 4 is a circuit diagram showing the circuit of the display device DSP.

As shown in FIG. 4, in the display portion DA, the display device DSP comprises a plurality of scanning lines G, a plurality of signal lines S, a plurality of scanning lines GP, a plurality of signal lines SP, a plurality of metal lines (cathode lines) ML4, a common electrode CE and the like. In the non-display portion NDA, the display device DSP comprises a scanning line driving circuit GD, a scanning line driving circuit GPD, a signal line driving circuit SD, a read circuit SPD, a reset circuit RSD, a reference circuit VRD, a first voltage supplier CD1, a second voltage supplier CD2 and the like. The integrated circuit 1 is connected to each of the scanning line driving circuit GD, the scanning line driving circuit GPD, the signal line driving circuit SD, the read circuit SPD, the reset circuit RSD, the reference circuit VRD, the first voltage supplier CD1 and the second voltage supplier CD2.

The scanning lines G and the scanning lines GP each extend in the first direction X and are arranged spaced apart from one another in the second direction Y. The signal lines S, the signal lines SP and the metal lines ML4 each extend in the second direction Y and are arranged spaced apart from one another in the first direction X. In addition, the signal lines SP and the metal lines ML4 are disposed overlapping each other as will be described later, and the signal lines SP and the signal lines S are disposed overlapping each other in certain places. The scanning lines G are drawn to the non-display portion NDA and are connected to the scanning line driving circuit GD. The scanning lines GP are drawn to the non-display portion NDA and are connected to the scanning line driving circuit GPD. The signal lines S are drawn to the non-display portion NDA and are connected to the signal line driving circuit SD. The signal lines SP are drawn to the non-display portion NDA and each are connected to the read circuit SPD, the reference circuit VRD and the reset circuit RSD. Note that the scanning lines G, the scanning lines GP, the signal lines SP and the signal lines S do not necessarily extend linearly but may be partly bent.

The common electrode CE is disposed for each sensor block B. The common electrodes CE are connected to the first voltage supplier CD1 which supplies the common voltage to the pixels PX. The metal lines ML4 each are electrically connected to the photoelectric conversion elements PD. The metal lines (cathode lines) ML4 are connected to the second voltage supplier CD2 which supplies a cathode voltage to the photoelectric conversion elements PD. In addition, the common electrodes CE each are also connected to the touch controller TC as described above, and each function as the sensor electrode Rx.

Each pixel PX comprises a switching element SW and a pixel electrode PE. The pixels PX share the common electrode CE and the liquid crystal layer LC. The switching element SW is composed of, for example, a thin-film transistor, and is electrically connected to the scanning line G and the signal line S. The scanning line G is connected to the gate of the switching element SW in each of the pixels PX arranged in the first direction X. The signal line S is connected to the source of the switching element SW in each of the pixels PX arranged in the second direction Y. The pixel electrode PE is electrically connected to the drain of the switching element SW. The pixel electrodes PE each are opposed to the common electrode CE, and each drive the liquid crystal layer LC by an electric field produced between themselves and the common electrode CE. A capacitance CS is formed between, for example, an electrode of the same potential as the common electrode CE and an electrode of the same potential as the pixel electrode PE.

A switching element SWP is composed of, for example, a thin-film transistor, and is electrically connected to the scanning line GP and the signal line SP. The scanning line GP is connected to the gate of the switching element SWP. The signal line SP is connected to the source of the switching element SWP. The anode of a photoelectric conversion element PD and a capacitance element CSP are electrically connected to the drain of the switching element SWP. To the cathode of the photoelectric conversion element PD, a cathode potential is applied from the second voltage supplier CD2 via the metal line (cathode line) ML4 (see FIGS. 4 and 8). When light is emitted to the photoelectric conversion element PD, a current according to the amount of light flows to the photoelectric conversion element PD, and a charge is stored in the capacitance element CSP.

A switching element SWR is disposed in each signal line SP. A signal line VS is connected to the source of the switching element SWR. A signal line RS is connected to the gate of the switching element SWR. The reset circuit RSD supplies a reset signal to the signal line RS. The switching elements SWR are turned on, and the signal lines SP are electrically connected to the signal line VS. The reference circuit VRD supplies a reference signal VR1 to the signal line VS. Accordingly, the reference signal VR1 is supplied to the capacitance elements CSP.

Figure 5:
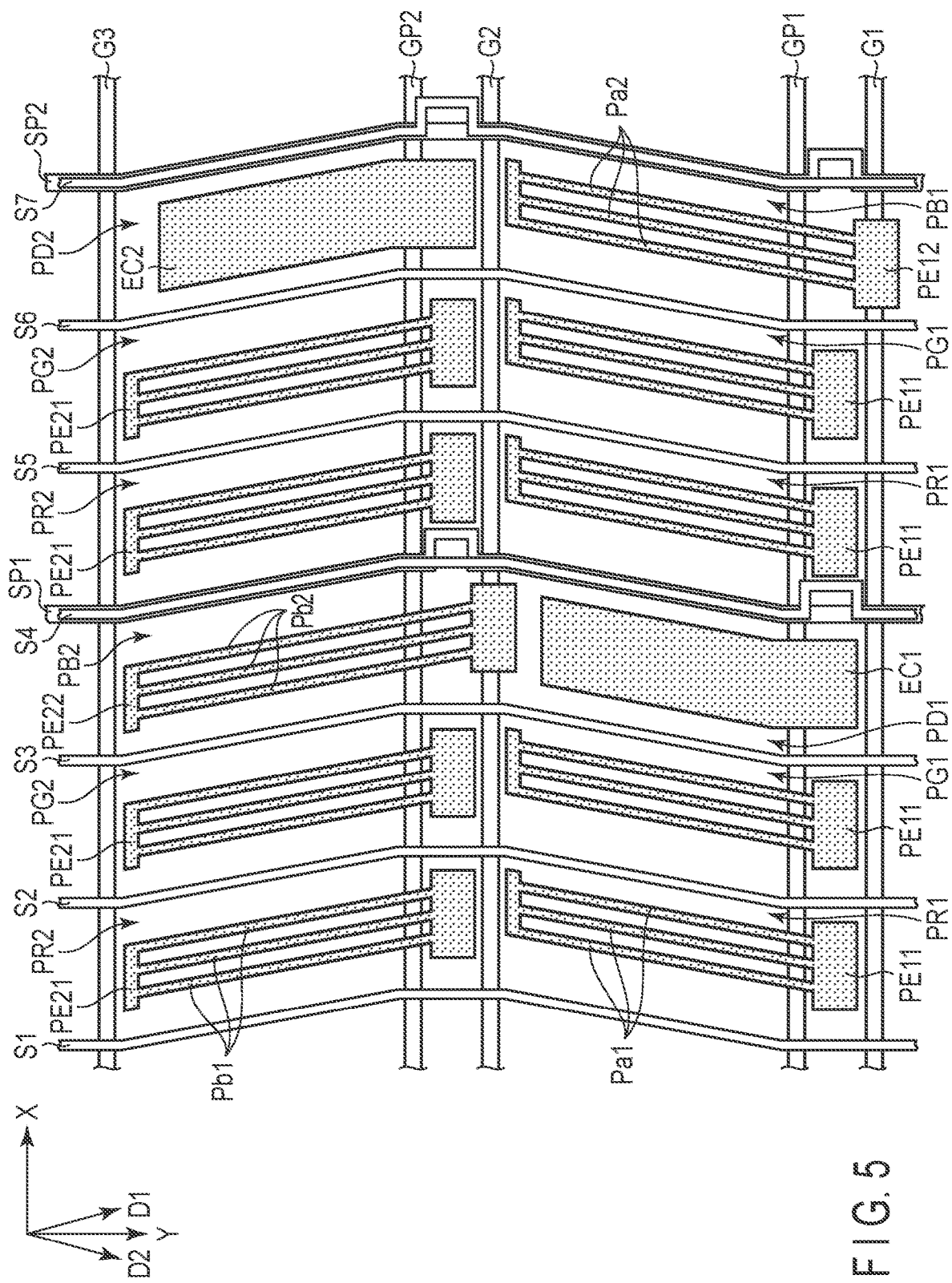
FIG. 5 is a plan view showing an example of the layout of the pixels and the photoelectric conversion elements shown in FIG. 3.

FIG. 5 is a plan view showing an example of the layout of the pixels PX and the photoelectric conversion elements PD shown in FIG. 3.

As shown in FIG. 5, a scanning line G1 to a scanning line G3 each extend linearly in the first direction X, and are arranged spaced apart from one another in the second direction Y. A scanning line GP1 and a scanning line GP2 extend linearly in the first direction X, and are arranged spaced apart from each other in the second direction Y. The scanning line GP1 is located between the scanning line G1 and the scanning line G2, and the scanning line GP2 is located between the scanning line G2 and the scanning line G3. Signal lines S1 to S7 extend substantially in the second direction Y, and are arranged spaced apart from one another in the first direction X. A signal line SP1 and a signal line SP2 extend substantially along the second direction Y, and are arranged spaced apart from each other in the first direction X.

The signal line SP1 and the signal line S4 overlap each other in planar view. Between the scanning line G1 and the scanning line GP1, the signal line SP1 extends linearly, and the signal line S4 is bent into a substantially U shape. Therefore, in a certain place between the scanning line G1 and the scanning line GP1, the signal line SP1 and the signal line S4 have non-overlapping parts each other in planar view. Between the scanning line G2 and the scanning line GP2, the signal line S4 extends linearly, and the signal line SP1 is bent into a substantially U shape. Therefore, in a certain place between the scanning line G2 and the scanning line GP2, the signal line SP1 and the signal line S4 have non-overlapping parts each other in planar view.

In addition, although not shown in the drawing, the metal line ML4 (see FIGS. 4 and 8) is also disposed overlapping the signal line SP1 and the signal line S4 in planar view.

Between the scanning line G1 and the scanning line G2, a red pixel PR1, a green pixel PG1, a photoelectric conversion element PD1, a red pixel PR1, a green pixel PG1 and a blue pixel PB1 are arranged in this order in the first direction X.

Pixel electrodes PE11 of the same shape are disposed in the red pixel PR1 and the green pixel PG1, respectively, a pixel electrode PE12 of a larger size than the pixel electrodes PE11 is disposed in the blue pixel PB1, and an electrode EC1 is disposed in the photoelectric conversion element PD1. Regarding a length along the second direction Y, the pixel electrodes PE11 are shorter than the pixel electrode PE12, and the electrode EC1 is shorter than the pixel electrodes PE11. The pixel electrodes PE11 and the electrode EC1 are located between the scanning line G1 and the scanning line G2. The pixel electrode PE12 is located between the scanning line G1 and the scanning line G2 and crosses the scanning line G1.

The pixel electrodes PE11 and the pixel electrode PE12 have strip electrodes Pa1 and strip electrodes Pa2 extending in the direction D2, respectively. In the illustrated example, the number of strip electrodes Pa1 and the number of strip electrodes Pa2 are three. The strip electrodes Pa1 and the strip electrodes Pa2 are located between the scanning line G1 and the scanning line G2. Regarding a length in the direction D2, the strip electrodes Pa2 are longer than the strip electrodes Pa1. The electrode EC1 has a portion extending in the second direction Y and a portion extending the direction D2. In the illustrated example, the electrode EC1 extends along the signal line S3.

Between the scanning line G2 and the scanning line G3, a red pixel PR2, a green pixel PG2, a blue pixel PB2, a red pixel PR2, a green pixel PG2 and a photoelectric conversion element PD2 are arranged in this order along the first direction X. The red pixel PR1 and the red pixel PR2, and the green pixel PG1 and the green pixel PG2, and the photoelectric conversion element PD1 and the blue pixel PB2 are arranged in the second direction Y, respectively.

Although not described in detail, pixel electrodes PE21 of the same shape are disposed in the red pixel PR2 and the green pixel PG2, respectively, a pixel electrode PE22 of a larger size than the pixel electrodes PE21 is disposed in the blue pixel PB2, and an electrode EC2 is disposed in the photoelectric conversion element PD2. The pixel electrodes PE21 and the pixel electrode PE22 have strip electrodes Pb1 and strip electrodes Pb2 extending in the direction D1, respectively. The pixel electrodes PE21, the pixel electrode PE22 and the electrode EC2 have similar shapes to the pixel electrodes PE11, the pixel electrode PE12 and the electrode EC1, respectively. The signal line SP2 and the signal line S7 substantially overlap each other in planar view but do not overlap each other in certain places between the scanning line C1 and the scanning line GP1 and between the scanning line G2 and the scanning line GP2.

Figure 6:
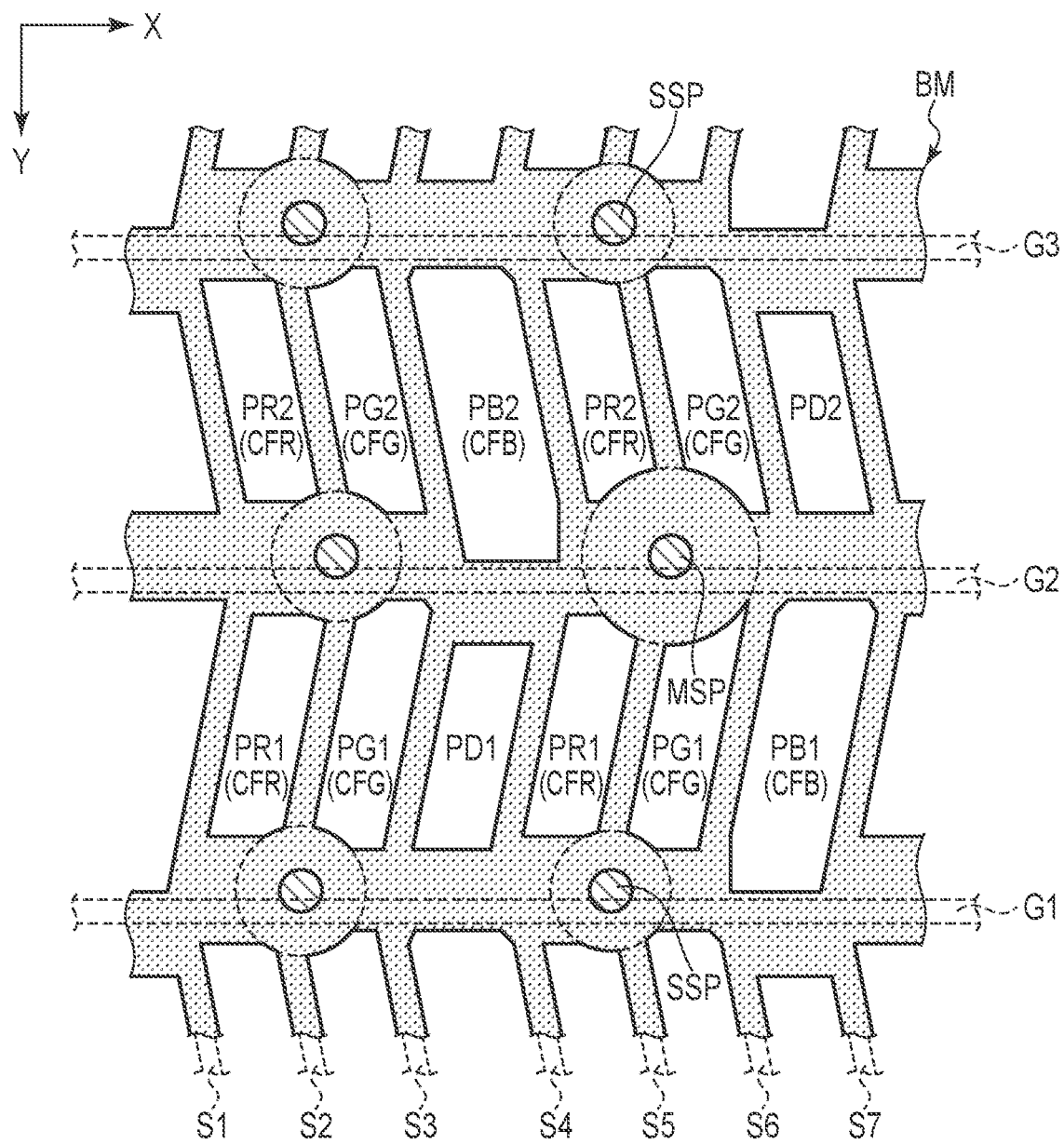
FIG. 6 is a plan view showing a light-shielding layer corresponding to the layout of the pixels and the photoelectric conversion elements shown in FIG. 5.

FIG. 6 is a plan view showing a light-shielding layer BM corresponding to the layout of the pixels PX and the photoelectric conversion elements PD shown in FIG. 5.

As shown in FIG. 6, a light-shielding layer BM is formed in a lattice shape, and overlaps the scanning lines G1 to G3 and the signal lines S1 to S7 in planar view. This light-shielding layer BM surrounds each of the red pixels PR1, the red pixels PR2, the green pixels PG1, the green pixels PG2, the blue pixel PB1, the blue pixel PB2, the photoelectric conversion element PD1 and the photoelectric conversion element PD2.

The signal line S5 is located between the red pixel PR1 and the green pixel PG1 and between the red pixel PR2 and the green pixel PG2. A main spacer MSP and a sub-spacer SSP both overlap the signal line S5. The main spacer MSP forms a cell gap between the first substrate SUB1 and the second substrate SUB2, and the sub-spacer SSP has a height less than the height of the main spacer MSP.

The light-shielding layer BM is expanded substantially concentrically with the sub-spacer SSP around the sub-spacer SSP. In addition, the light-shielding layer BM is expanded substantially concentrically with the main spacer MSP around the main spacer MSP.

A red colored layer CFR is disposed in the red pixels PR1 and the red pixels PR2, a green colored layer CFG is disposed in the green pixels PG1 and the green pixels PG2, and a blue colored layer CFB is disposed in the blue pixel PB1 and the blue pixel PB2. No colored layer is disposed in the photoelectric conversion element PD1 and the photoelectric conversion element PD2.

Figure 7:
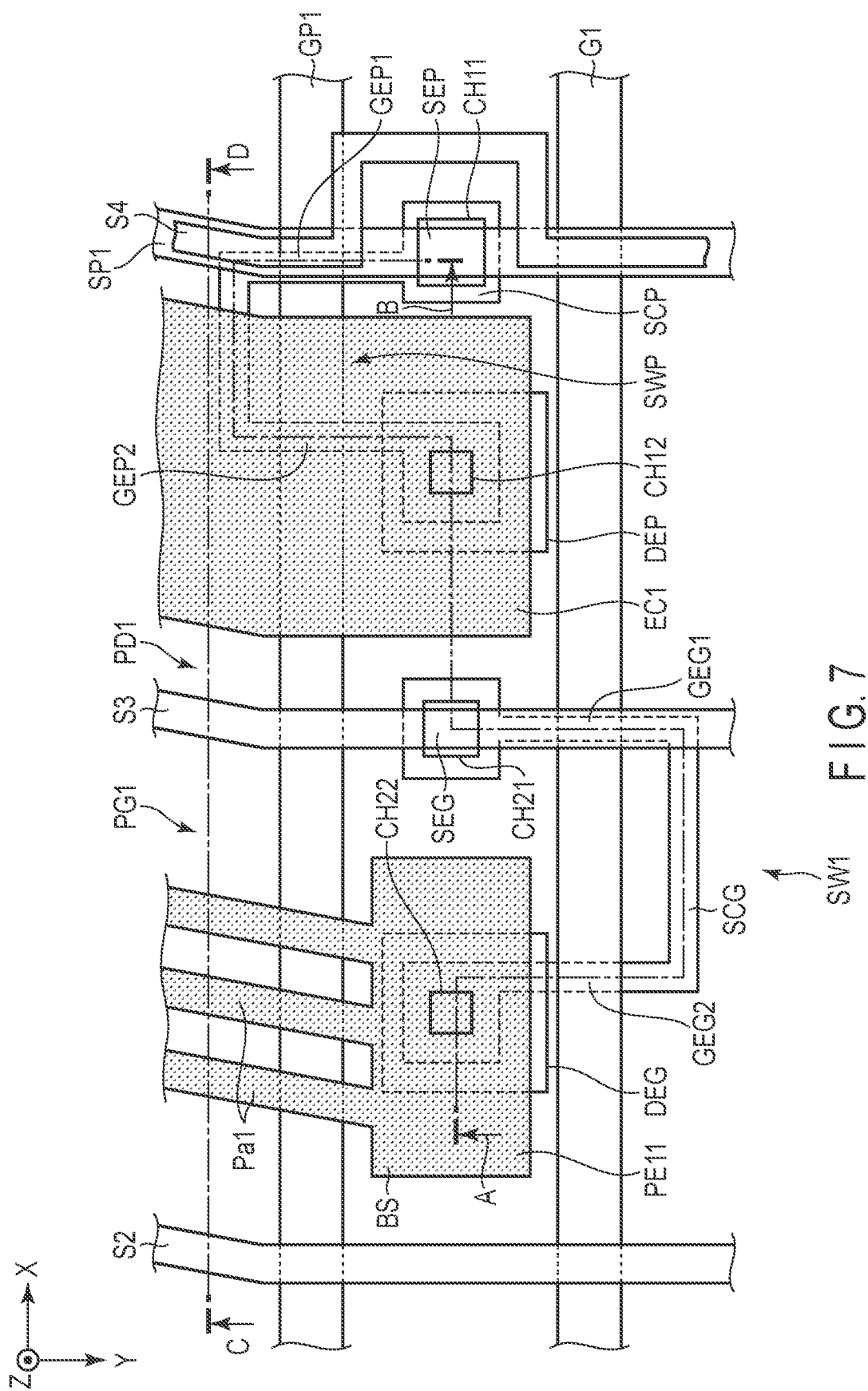
FIG. 7 is a plan view showing an example of the pixel and the photoelectric conversion element shown in FIG. 5.

FIG. 7 is a plan view showing an example of the pixel and the photoelectric conversion element shown in FIG. 5. The main parts of them will be described here by focusing on the green pixel PG1 and the photoelectric conversion element PD1 surrounded by the scanning line G1 and the scanning line GP1, and the signal line S2 and the signal line S4 shown in FIG. 5.

As shown in FIG. 7, the photoelectric conversion element PD1 comprises the switching element SWP. The switching element SWP is electrically connected to the scanning line GP1 and the signal line SP1.

The illustrated switching element SWP has a double-gate structure but may have a single-gate structure. The switching element SWP comprises a semiconductor layer SCP and a drain electrode DEP. The semiconductor layer SCP is disposed such that one part overlaps the signal line SP1 and the other part extends between the signal line SP1 and the signal line S3, and is formed in a substantially U shape. The semiconductor layer SCP crosses the scanning line GP1 in a region overlapping the signal line SP1 and between the signal line SP1 and the signal line S3. In the scanning line GP1, the regions overlapping the semiconductor layer SCP function as a gate electrode GEP1 and a gate electrode GEP2, respectively. In the signal line SP1, the region overlapping the semiconductor layer SCP functions as a source electrode SEP. The semiconductor layer SCP is electrically connected to the source electrode SEP through a contact hole CH11 at one end, and is electrically connected to the drain electrode DEP through a contact hole CH12 at the other end. The drain electrode DEP is formed in an island shape, and is disposed between the signal line S3 and the signal line SP1. The signal line S4 is disposed such that one part overlaps the signal line SP1 and the other part extends between the scanning line G1 and the scanning line GP1, and is formed such that it detours around the contact hole CH11. The electrode EC1 overlaps the drain electrode DEP and is electrically connected to the drain electrode DEP. A connection portion which connects the electrode EC1 and the switching element SWP will be described later.

The green pixel PG1 comprises a switching element SW1. The switching element SW1 is electrically connected to the scanning line G1 and the signal line S3.

The illustrated switching element SW1 has a double-gate structure but may have a single-gate structure. The switching element SW1 comprises a semiconductor layer SCG and a drain electrode DEG. The semiconductor layer SCG is disposed such that one part overlaps the signal line S3 and the other part extends between the signal line S2 and the signal line S3, and is formed in a substantially U shape. The semiconductor layer SCG crosses the scanning line G1 in a region overlapping the signal line S3 and between the signal line S2 and the signal line S3. In the scanning line G1, the regions overlapping the semiconductor layer SCG function as a gate electrode GEG1 and a gate electrode GEG2, respectively. In the signal line S3, the region overlapping the semiconductor layer SCG functions as a source electrode SEG. The semiconductor layer SCG is electrically connected to the source electrode SEG through a contact hole CH21 at one end, and is electrically connected to the drain electrode DEG through a contact hole CH22 at the other end. The drain electrode DEG is formed in an island shape, and is disposed between the signal line S5 and the signal line S6.

The pixel electrode PE11 comprises a base portion BS integrally formed with the strip electrodes Pa1. The base portion BS overlaps the drain electrode DEG. The base portion BS is electrically connected to the drain electrode DE. A connection portion which connects the pixel electrode PE11 and the switching element SW1 will be described later.

Figure 8:
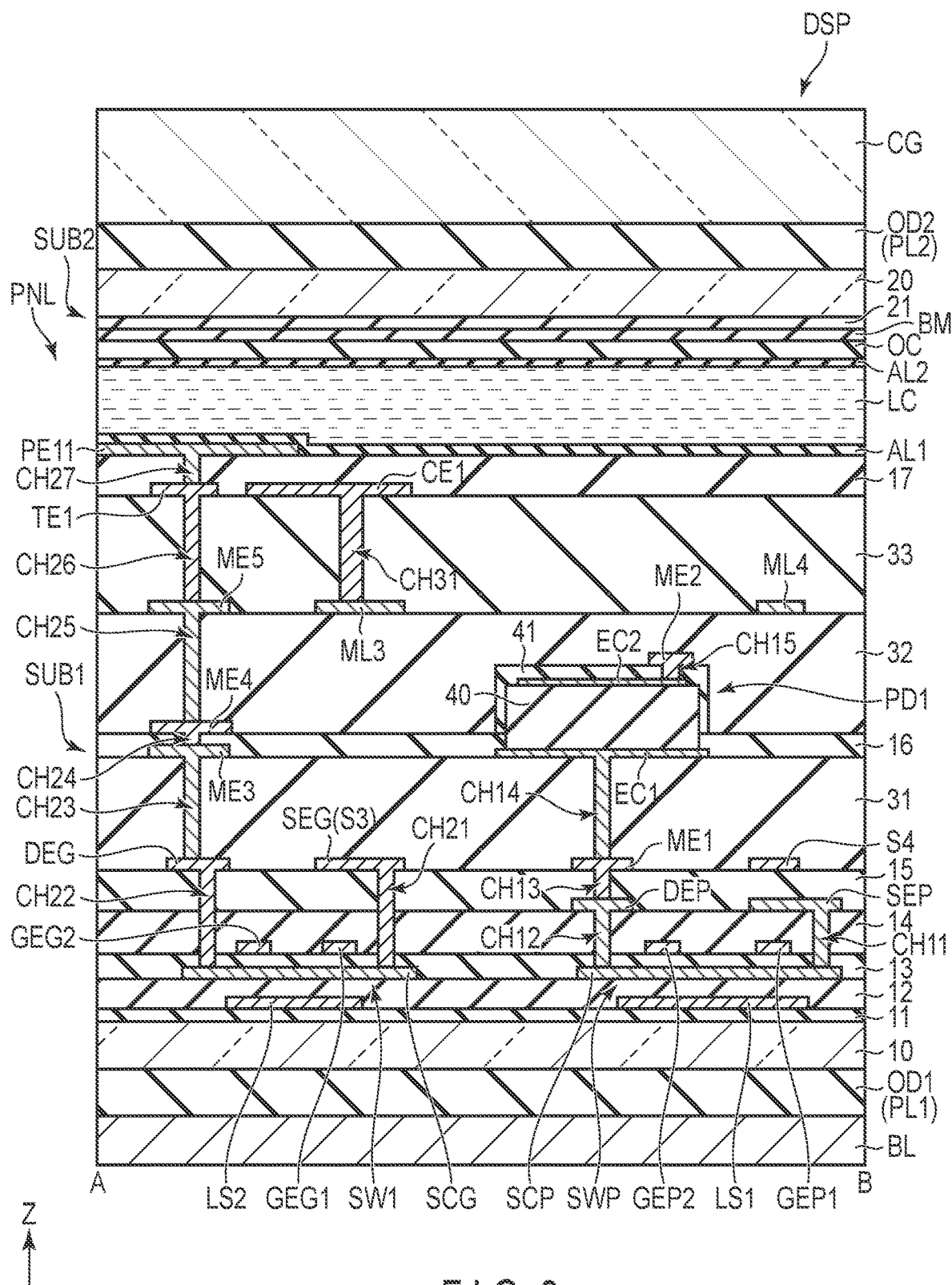
FIG. 8 is a cross-sectional view showing the display device along line A-B of FIG. 7.

FIG. 8 is a cross-sectional view showing the display device DSP along line A-B of FIG. 7.

As shown in FIG. 8, the display device DSP further comprises a cover glass CG, an optical film OD1, an optical film OD2 and a backlight BL in addition to the display panel PNL.

The optical film OD1 includes a polarizer layer PL1 and is bonded to the first substrate SUB1. The optical film OD2 includes a polarizer layer PL2 and is bonded to the second substrate SUB2. The optical film OD1 and the optical film OD2 have a basic structure in which a polarizer layer is held between a pair of supports, but may include another optical function layer such as a retardation layer. In addition, the cover glass CG may be bonded to the optical film OD2, and the backlight BL may be bonded to the optical film OD1. The backlight BL emits light to the display panel PNL in a direction from the first substrate SUB1 to the second substrate SUB2 (the third direction Z). For example, a plurality of light-emitting diodes (LEDs) are mounted on the backlight BL. The backlight BL can perform local dimming control in which the display portion DA is divided into a plurality of areas and the LEDs located in the divided areas are controlled.

The first substrate SUB1 comprises an insulating basement 10, an insulating layer 11 to an insulating layer 17, an insulating layer 31 to an insulating layer 33, a light-shielding layer LS1, a light-shielding layer LS2, a connection electrode ME1 to a connection electrode ME5 and a transparent electrode TE1.

The insulating basement 10 is a basement formed of a resin material such as polyimide and having flexibility and optical transparency. The insulating basement 10 is covered with the insulating layer 11. The light-shielding layer LS1 and the light-shielding layer LS2 are located on the insulating layer 11 and are covered with the insulating layer 12. The light-shielding layer LS1 and the light-shielding layer LS2 are formed of, for example, a metal material such as aluminum (Al), titanium (Ti), silver (Ag), molybdenum (Mo), tungsten (W), copper (Cu) or chromium (Cr). The semiconductor layer SCG and the semiconductor layer SCP are located on the insulating layer 12 and are covered with the insulating layer 13. The semiconductor layer SCG is located above the light-shielding layer LS2, and the semiconductor layer SCP is located above the light-shielding layer LS1. The semiconductor layer SCG and the semiconductor layer SCP are formed of, for example, polycrystalline silicon, but may be formed of amorphous silicon or oxide semiconductor.

The gate electrode GEG1 and the gate electrode GEG2 which are parts of the scanning line G1, and the gate electrode GEP1 and the gate electrode GEP2 which are parts of the scanning line GP1 are located on the insulating layer 13 and are covered with the insulating layer 14. The gate electrode GEG1 and the gate electrode GEG2 overlap the light-shielding layer LS2 in the third direction Z, and the gate electrode GEP1 and the gate electrode GEP2 overlap the light-shielding layer LS1 in the third direction Z. The scanning line G1 and the scanning line GP1 are formed of the metal material described above, an alloy of the metal materials combined together or the like, and may have a single-layer structure or a multilayer structure.

The source electrode SEP and the drain electrode DEP are located on the insulating layer 14 and are covered with the insulating layer 15. The source electrode SEP is connected to the semiconductor layer SCP through the contact hole CH11 penetrating the insulating layer 13 and the insulating layer 14. The drain electrode DEP is connected to the semiconductor layer SCP through the contact hole CH12 penetrating the insulating layer 13 and the insulating layer 14.

The source electrode SEG, the drain electrode DEG, the connection electrode ME1 and the signal line S4 are located on the insulating layer 15 and are covered with the insulating layer 31. The source electrode SEG is connected to the semiconductor layer SCG through a contact hole CH21 penetrating the insulating layer 13 to the insulating layer 15. The drain electrode DEG is connected to the semiconductor layer SCG through a contact hole CH22 penetrating the insulating layer 13 to the insulating layer 15. The connection electrode ME1 is connected to the drain electrode DEP through a contact hole CH13 penetrating the insulating layer 15. The signal line S4 is located above the source electrode SEP but does not overlap the contact hole CH11.

The source electrode SEP, the drain electrode DEP, the source electrode SEG and the drain electrode DEG may be formed of the metal material described above, an alloy of the metal materials combined together or the like, and may have a single-layer structure or a multilayer structure. In one example, they are formed of a stack including titanium (Ti), aluminum (Al) and titanium (Ti) stacked in order.

The switching element SW1 and the switching element SWP are formed between the insulating basement 10 and the insulating layer 31. The switching element SW1 and the switching element SWP illustrated here have a top-gate structure in which a gate electrode is disposed above a semiconductor layer. However, they may have a bottom-gate structure in which a gate electrode is disposed below a semiconductor layer.

The photoelectric conversion element PD1 is located between the insulating layer 31 and the insulating layer 32 and is covered with a sealing layer 41. The photoelectric conversion element PD1 is, for example, a positive-intrinsic-negative (PIN) photodiode using silicon as an active layer 40 which will be described later. The photoelectric conversion element PD1 can detect visible light, and can authenticate a fingerprint, for example. The photoelectric conversion element PD1 comprises the electrode EC1, an active layer 40 and the electrode EC2. The electrode EC1 is located on the insulating layer 31 and is covered with the insulating layer 16. The electrode EC1 is connected to the connection electrode ME1 through a contact hole CH14 penetrating the insulating layer 31. The photoelectric conversion element PD1 is electrically connected to the switching element SWP via the connection electrode ME1. The electrode EC1 is a transparent electrode formed of a transparent conductive material such as indium tin oxide (ITO) or indium zinc oxide (IZO). The active layer 40 is located on the electrode EC1 and is covered with the electrode EC2. The active layer 40 is located between the electrode EC1 and the electrode EC2. The active layer 40 has, for example, a p-type semiconductor, an n-type semiconductor, and an insulating i-type semiconductor formed between the p-type semiconductor and the n-type semiconductor. The p-type semiconductor is connected to the electrode EC2, and the n-type semiconductor is connected to the electrode EC1. The electrode EC2 is located on the active layer 40 and is covered with the sealing layer 41. The electrode EC2 is a transparent electrode formed of a transparent conductive material such as ITO or IZO. The connection electrode ME2 is located on the sealing layer 41 and is covered with the insulating layer 32. The connection electrode ME2 is connected to the electrode EC2 through a contact hole CH15 penetrating the sealing layer 41. The connection electrode ME2 is electrically connected to, for example, the metal line ML4 which is the cathode line described above, and the cathode potential is supplied to it.

The connection electrode ME3 is located on the insulating layer 31 and is covered with the insulating layer 16. The connection electrode ME3 is connected to the drain electrode DEG through a contact hole CH23 penetrating the insulating layer 31. The connection electrode ME4 is located on the insulating layer 16 and is covered with the insulating layer 32. The connection electrode ME4 is connected to the connection electrode ME3 through a contact hole CH24 penetrating the insulating layer 16.

The connection electrode ME5, a metal line ML3 and the metal line ML4 are located on the insulating layer 32 and are covered with the insulating layer 33. The connection electrode ME5 is connected to the connection electrode ME4 through a contact hole CH25 penetrating the insulating layer 32. The metal line ML3 and the metal line ML4 are located between the insulating layer 32 and the insulating layer 33. The metal line ML3 is located above the signal line S3, and the metal line ML4 is located above the signal line S4. The metal line ML3 functions as the sensor line L electrically connected to the sensor electrode Rx. The connection electrode ME5, the metal line ML3 and the metal line ML4 may be formed of the same material.

The transparent electrode TE1 and a common electrode CE1 are located on the insulating layer 33 and are covered with the insulating layer 17. The transparent electrode TE1 is connected to the connection electrode ME5 through a contact hole CH26 penetrating the insulating layer 33. The common electrode CE1 is located between the insulating layer 33 and the pixel electrode PE11. The common electrode CE1 is connected to the metal line ML3 through a contact hole CH31 penetrating the insulating layer 33. The common electrode CE also functions as the sensor electrode Rx.

The pixel electrode PE11 is located on the insulating layer 17 and is covered with an alignment film AL1. The pixel electrode PE11 is connected to the transparent electrode TE1 through a contact hole CH27 penetrating the insulating layer 17. The pixel electrode PE11 is electrically connected to the switching element SW1 through the transparent electrode TE1 and the connection electrode ME3 to the connection electrode ME5.

The transparent electrode TE1, the common electrode CE1 and the pixel electrode PE11 each are a transparent electrode formed of a transparent conductive material such as ITO or IZO.

Here, attention is focused on the positional relationship between the insulating layer 31 to the insulating layer 33 and each member. The insulating layer 31 is located above the switching element SW1 and the switching element SWP. The insulating layer 33 is located above the insulating layer 31. The insulating layer 32 is located between the insulating layer 31 and the insulating layer 33. The connection electrode ME3, the connection electrode ME4 and the photoelectric conversion element PD1 each are located between the insulating layer 31 and the insulating layer 32. In addition, the photoelectric conversion element PD1 is located between the insulating layer 31 and the pixel electrode PE11. The connection electrode ME5 is located between the insulating layer 32 and the insulating layer 33. The pixel electrode PE11 and the common electrode CE1 each are located above the insulating layer 31 to the insulating layer 33.

The insulating layer 11 to the insulating layer 17 each are, for example, an inorganic insulating layer of silicon oxide, silicon nitride or silicon oxynitride, and may have a single-layer structure or a multilayer structure. The insulating layer 31 to the insulating layer 33 each are, for example, an organic insulating layer such as acrylic resin.

The second substrate SUB2 comprises an insulating basement 20, an insulating layer 21, a light-shielding layer BM, an overcoat layer OC and an alignment film AL2. The insulating basement 20 is a basement formed of a resin material such as polyimide and having flexibility and optical transparency. The insulating basement 20 is opposed to the insulating basement 10. The insulating layer 21 is located on a side of the insulating basement 20 which is opposed to the first substrate SUB1. The insulating layer 21 is an inorganic insulating layer of, for example, silicon oxide, silicon nitride or silicon oxynitride, and may have a single-layer structure or a multilayer structure.

The light-shielding layer BM and the overcoat layer OC are located closer to the first substrate SUB1 than the insulating layer 21. The overcoat layer OC covers the light-shielding layer BM. The alignment film AL2 covers the overcoat layer OC. The overcoat layer OC is formed of transparent resin. Although not illustrated here, the main spacers MSP and the sub-spacers SSP described above are formed of a resin material, and are disposed between the first substrate SUB1 and the second substrate SUB2.

The liquid crystal layer LC is located between the first substrate SUB1 and the second substrate SUB2, and is in contact with the alignment film AL1 and the alignment film AL2.

Figure 9:
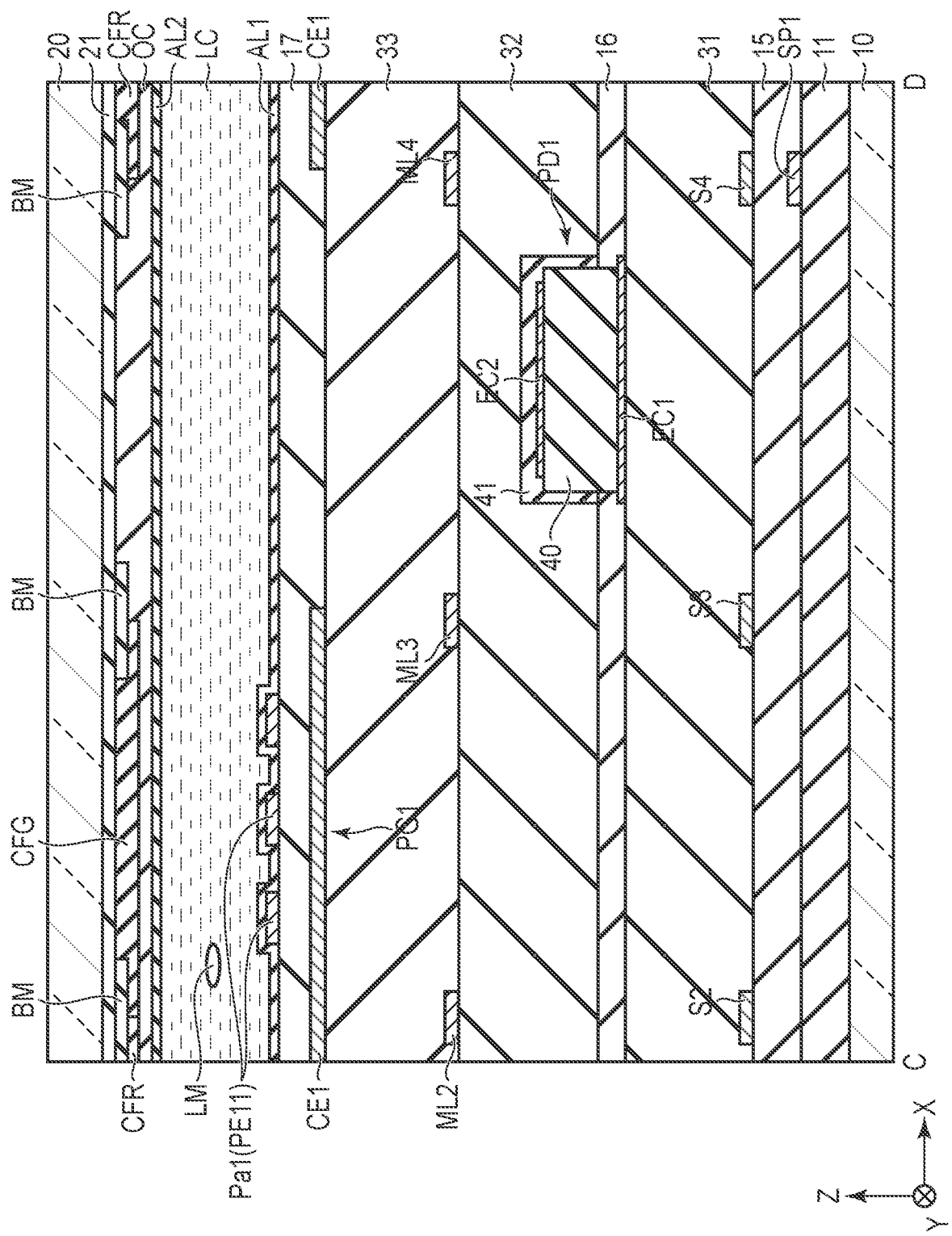
FIG. 9 is a cross-sectional view showing a display panel along line C-D of FIG. 7.

FIG. 9 is a cross-sectional view of the display panel PNL along line C-D shown in FIG. 7. The illustrated example corresponds to a case of employing a fringe field switching (FFS) mode which is one of display modes using a lateral electric field.

As shown in FIG. 9, in the first substrate SUB1, the signal line S2 to the signal line S4 are located on the insulating layer 15 and are covered with the insulating layer 31. The metal line ML2 to the metal line ML4 are located directly above the signal line S2 to the signal line S4, respectively. In the illustrated example, the common electrode CE1 does not overlap the photoelectric conversion element PD1. The strip electrodes Pa1 of the pixel electrode PE11 are located on the insulating layer 17 and are covered with the alignment film AL1.

The second substrate SUB2 further comprises the colored layer CFR, the colored layer CFG and the colored layer CFB. The colored layer CFR, the colored layer CFG and the colored layer CFB are located between the insulating layer 21 and the overcoat layer OC. The colored layer CFG is disposed at a position opposed to the pixel electrode PE11, and partly overlaps the light-shielding layer BM. The overcoat layer OC covers the colored layer CFG. Similarly to the colored layer CFG, the other colored layers CFR and CFB are disposed at positions opposed to the respective pixel electrodes and are covered with the overcoat layer OC. The overcoat layer OC is in contact with the insulating layer 21 between the colored layer CFG and the colored layer CFR. None of the colored layers is disposed at a position opposed in the third direction Z to the photoelectric conversion element PD1.

The liquid crystal layer LC comprises liquid crystal molecules LM. The liquid crystal layer LC is composed of a positive liquid crystal material (whose dielectric anisotropy is positive) or a negative liquid crystal material (whose dielectric anisotropy is negative).

In this display panel PNL, in an off state where no electric field is formed between the pixel electrode PE11 and the common electrode CE1, the liquid crystal molecules LM are initially aligned in a predetermined direction between the alignment film AL1 and the alignment film AL2. In the off state, light traveling to the display panel PNL is absorbed by the optical film OD1 and the optical film OD2, and dark display is realized. On the other hand, in an on state where an electric field is formed between the pixel electrode PE and the common electrode CE, the liquid crystal molecules LM are aligned in a direction different from the initial alignment direction by the electric field, and the alignment direction is controlled by the electric field. In the on state, a part of the light from the backlight BL is transmitted through the optical film OD1 and the optical film OD2, and light display is realized.

Figure 10:
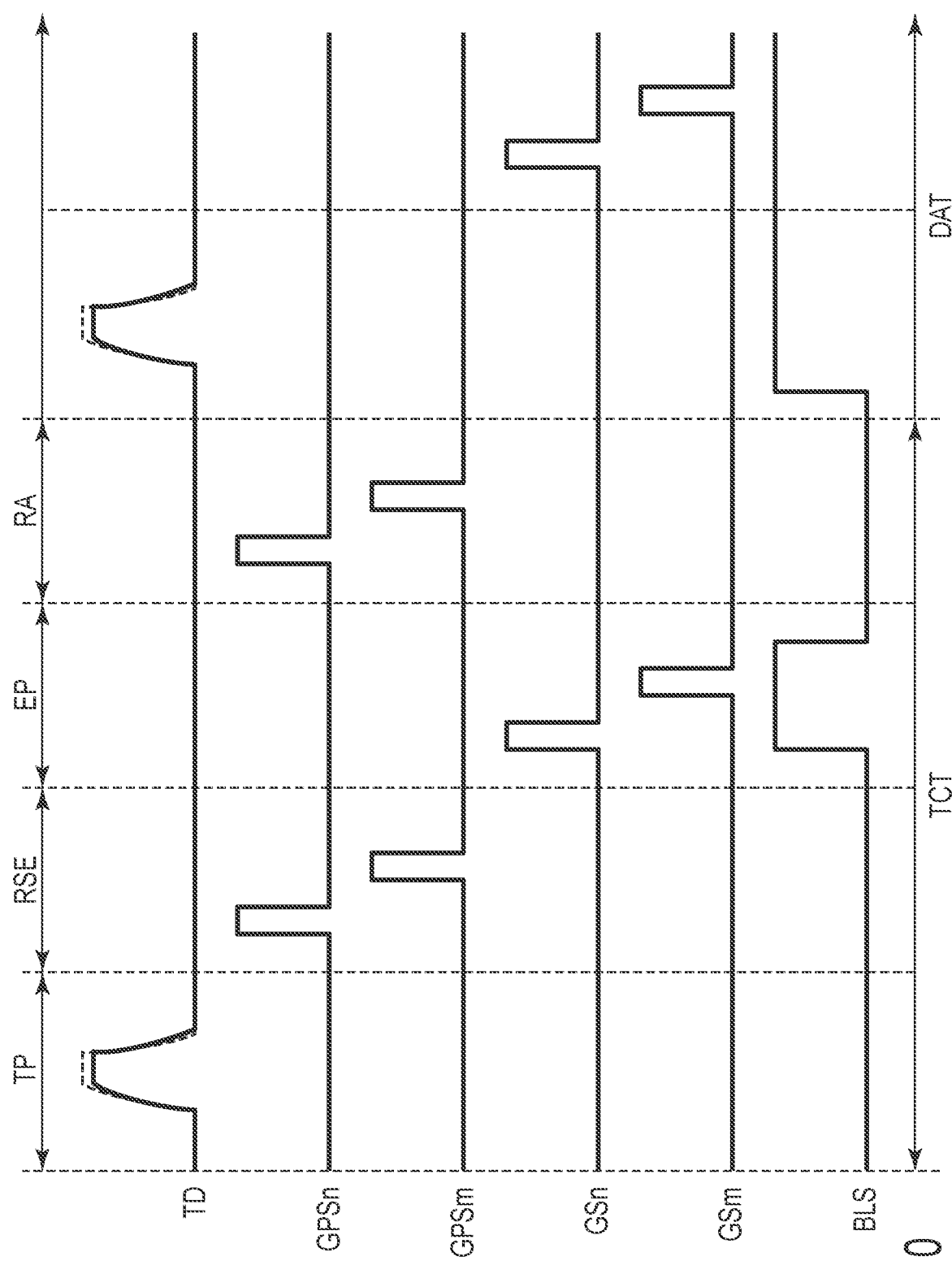
FIG. 10 is an illustration for explaining an example of the display period and the detection period of the display device of the present embodiment.

FIG. 10 is an illustration for explaining an example of a display period DAT and a detection period TCT of the display device DSP of the present embodiment.

In the present embodiment, a display period DAT includes a period in which a display operation of displaying an image in the display portion DA of the display panel PNL is executed. On the other hand, a detection period TCT includes a period in which a touch detection operation of detecting the contact and approach of an object with and to the display portion DA and a photodetection operation of emitting light to the object and detecting light reflected off the object are executed.

As the sensor electrodes Rx to which a touch drive signal is supplied in the detection period TCT, the common electrodes CE are used. That is, the common electrodes CE for image display in the display portion DA are also used as the sensor electrodes Rx for touch detection. Therefore, in the present embodiment, the display operation and the touch detection operation are executed in a time-sharing manner.

As shown in FIG. 10, the detection period TCT includes a touch sensor period TP, a reset period RSE, an exposure period EP and a read period RA.

In the touch sensor period TP, the touch drive signal is supplied to the common electrodes CE as the sensor electrodes Rx. In this case, a touch detection signal TD of a lower level than the outputs from the other sensor electrodes Rx (dashed line) is detected from the sensor electrode Rx (solid line) close to an object such as a finger, for example. Accordingly, the display device DSP can determine the contact position of the object (hereinafter referred to as a position P1).

In the reset period RSE, the reset circuit RSD supplies the reset signal to the signal line RS, and the reference circuit VRD supplies the reference signal VR1 to the signal line VS. The scanning line driving circuit GPD selects the scanning lines GP close to the position P1. The scanning line driving circuit GPD supplies a drive signal GPS to the scanning lines GP close to the position P1 sequentially.

Accordingly, in the reset period RSE, the capacitance elements CSP close to the position P1 are electrically connected to the respective signal lines, and the reference signal VR1 is supplied to them. The capacitance of each capacitance element CSP close to the position P1 is reset.

In the exposure period EP, a signal BLS which turns on the LED corresponding to the position P1 of the object is supplied to the backlight BL. An image signal is supplied to each signal line S. The scanning line driving circuit GD selects the scanning lines G close to the position P1. The scanning line driving circuit GD supplies a drive signal GS to the scanning lines G close to the position P1 sequentially.

Accordingly, in the exposure period EP, the pixel electrodes PE close to the position P1 are electrically connected to the respective signal lines, and the image signal is supplied to them. Light is emitted to the object via each pixel PX close to the position P1. Light reflected off the object enters the photoelectric conversion element PD1. According to the light entering the photoelectric conversion element PD1, a current flows in the photoelectric conversion element PD1. Accordingly, a charge is stored in each capacitance element CPS close to the position P1.

In the read period RA, the reset circuit RSD does not supply the reset signal to the signal line RS. The scanning line driving circuit GPD selects the scanning lines GP close to the position P1. The scanning line driving circuit GPD supplies the drive signal GPS to the respective scanning lines GP close to the position P1 sequentially.

Accordingly, in the read period RA, the capacitance elements CSP close to the position P1 are electrically connected to the respective signal lines SP. The charge stored in each capacitance element CSP in the exposure period EP is output to the read circuit SPD via the signal line SP.

Note that, in the exposure period EP, the signal BLS which turns on the LED corresponding to the position P1 of the object may be supplied to the backlight BL, and the image signal may be supplied to the pixels PX of each color. For example, the image signal is supplied only to each red pixel PR close to the position P1, and red light is emitted to the object, and red light reflected off the object enters the photoelectric conversion element PD1. Then, the image signal is supplied only to each green pixel PG close to the position P1, and green light is emitted to the object, and green light reflected off the object enters the photoelectric conversion element PD1. Then, the image signal is supplied only to each blue pixel PB close to the position P1, and blue light is emitted to the object, and blue light reflected off the object enters the photoelectric conversion element PD1. In this case, the photodetection controller PC can detect the amount of each color light received by the photoelectric conversion element PD1 and determine the color of the object.

According to the present embodiment, the first substrate SUB1 comprises the switching element SW1, the switching element SWP, the insulating layer 31 to the insulating layer 33 located above the switching element SW1 and the switching element SWP, the photoelectric conversion element PD1 located between the insulating layer 31 and the insulating layer 32 and electrically connected to the switching element SWP, the metal line ML located between the insulating layer 32 and the insulating layer 33, the common electrode CE located above the insulating layer 33 and connected to the metal line ML, and the pixel electrode PE1 located above the insulating layer 33 and electrically connected to the switching element SW1. Accordingly, the first substrate SUB1 can comprise the photoelectric conversion element PD1, the pixel PX and the touch sensor TS in the display portion DA, and the integrated circuit 1 includes the display driver DD, the touch controller TC and the photodetection controller PC. As compared with when the display panel PNL, the touch sensor TS and the photodetection device are manufactured separately and combined together, the number of integrated circuits can be reduced.

In addition, in the detection period TCT, the display device DSP can specify the position of an object approaching or contacting the display portion DA by the touch controller TC, emit light to the object at the specified position by the display driver DD, and detect light reflected off the object (photosense) by the photodetection controller PC. As compared with performing photosensing over the entire area in which the photoelectric conversion elements are disposed without specifying the position of the object, the detection period TCT can be shortened.

In the above-described embodiment, the switching element SW1 corresponds to a first switching element, the switching element SWP corresponds to a second switching element, the insulating layer 31 to the insulating layer 33 correspond to a first organic insulating layer to a third organic insulating layer, respectively, the connection electrode ME3 or the connection electrode ME4 corresponds to a first connection electrode, the connection electrode ME5 corresponds to a second connection electrode, the scanning line driving circuit GD corresponds to a first driving circuit, and the scanning line driving circuit GPD corresponds to a second driving circuit.

Figure 11:
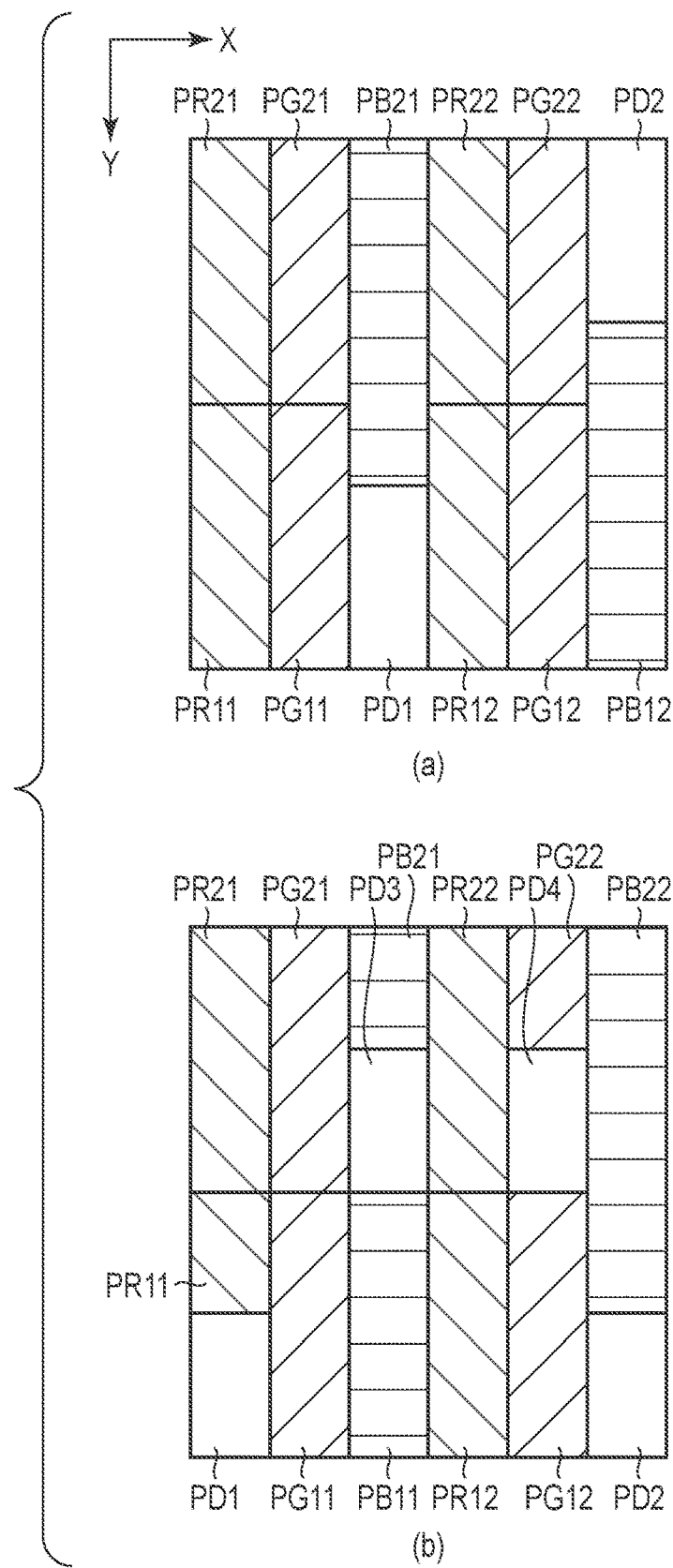
FIG. 11 is a plan view for explaining other examples of the layout of the pixels and the photoelectric conversion elements of the present embodiment.
Figure 12:
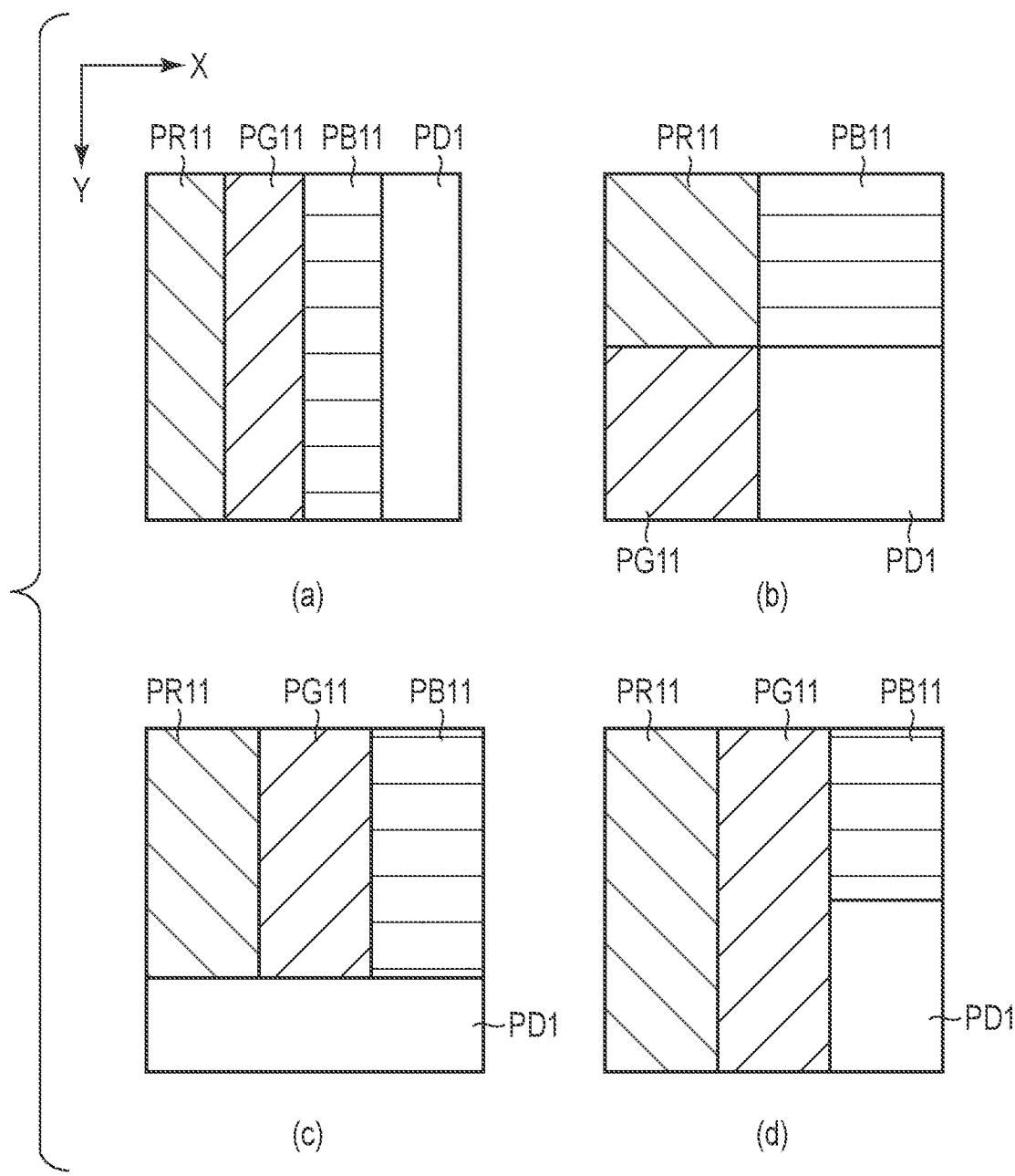
FIG. 12 is a plan view for explaining other examples of the layout of the pixels and the photoelectric conversion elements of the present embodiment.

Next, other examples of the layout of the pixels PX and the photoelectric conversion elements PD of the present embodiment will be described with reference to FIGS. 11 and 12. In FIGS. 11 and 12, the red pixels PR are shaded with downward-sloping lines, the green pixels PG are shaded with upward-sloping lines, and the blue pixels PB are shaded with horizontal lines.

FIG. 11 is a plan view for explaining two examples of the layout of the pixels and the photoelectric conversion elements of the present embodiment.

In the example shown in FIG. 11 (*a*), a red pixel PR11, a green pixel PG11, a photoelectric conversion element PD1, a red pixel PR12, a green pixel PG12 and a blue pixel PB12 are arranged in this order in the first direction X. A red pixel PR21, a green pixel PG21, a blue pixel PB21, a red pixel PR22, a green pixel PG22 and a photoelectric conversion element PD2 are arranged in this order in the first direction X.

The red pixel PR11 and the red pixel PR21, the green pixel PG11 and the green pixel PG21, the photoelectric conversion element PD1 and the blue pixel PB21, the red pixel PR12 and the red pixel PR22, the green pixel PG12 and the green pixel PG22, and the blue pixel PB12 and the photoelectric conversion element PD2 are arranged in the second direction Y, respectively.

The blue pixel PB21 extends between the green pixel PG11 and the red pixel PR12, and the blue pixel PB12 is opposed in the first direction X to the green pixel PG22.

In the example shown in FIG. 11 (*b*), a photoelectric conversion element PD1, a green pixel PG11, a blue pixel PB11, a red pixel PR12, a green pixel PG12 and a photoelectric conversion element PD2 are arranged in this order in the first direction X. A red pixel PR21, a green pixel PG21, a photoelectric conversion element PD3, a red pixel PR22, a photoelectric conversion element PD4 and a blue pixel PB22 are arranged in this order in the first direction X. The photoelectric conversion element PD1 and a red pixel PR11, the photoelectric conversion element PD2 and the blue pixel PB22, the photoelectric conversion element PD3 and a blue pixel PB21, and the photoelectric conversion element PD4 and the green pixel PG22 are arranged in the second direction Y, respectively.

The red pixel PR11 is located between the photoelectric conversion element PD1 and the red pixel PR21, the blue pixel PB21 is located between the green pixel PG21 and the red pixel PR22, and the green pixel PG22 is located between the red pixel PR22 and the blue pixel PB22. The blue pixel PB22 is opposed in the first direction X to the green pixel PG12.

FIG. 12 is a plan view for explaining four examples of the layout of the pixels and the photoelectric conversion elements of the present embodiment.

In the example shown in FIG. 12 (*a*), a red pixel PR11, a green pixel PG11, a blue pixel PB11 and a photoelectric conversion element PD1 are arranged in this order in the first direction X.

In the example shown in FIG. 12 (*b*), a red pixel PR11 and a blue pixel PB11, and a green pixel PG11 and a photoelectric conversion element PD1 are arranged in the first direction X, respectively. The red pixel PR11 and the green pixel PG11, and the blue pixel PB11 and the photoelectric conversion element PD1 are arranged in the second direction Y, respectively.

In the example shown in FIG. 12 (c), a red pixel PR11, a green pixel PG11 and a blue pixel PB11 are arranged in this order in the first direction X. The red pixel PR11, the green pixel PG11 and the blue pixel PB11 each are opposed in the second direction Y to a photoelectric conversion element PD1.

In the example shown in FIG. 12 (d), a red pixel PR11, a green pixel PG11 and a blue pixel PB11 are arranged in this order in the first direction X. The blue pixel PB11 and a photoelectric conversion element PD1 are arranged in the second direction Y. The blue pixel PB11 and the photoelectric conversion element PD1 are opposed in the first direction X to the green pixel PG11.

It is possible to change the balance between the display performance and the detection performance in the display portion DA of the display device DSP by changing the layout of the pixels and the photoelectric conversion elements as described above.

Next, a plurality of modification examples of the present embodiment will be described with reference to FIGS. 13 to 18. In FIGS. 13 and 15 to 17, the illustration of a part between the electrode EC1 and the insulating layer 11 is omitted.

Figure 13:
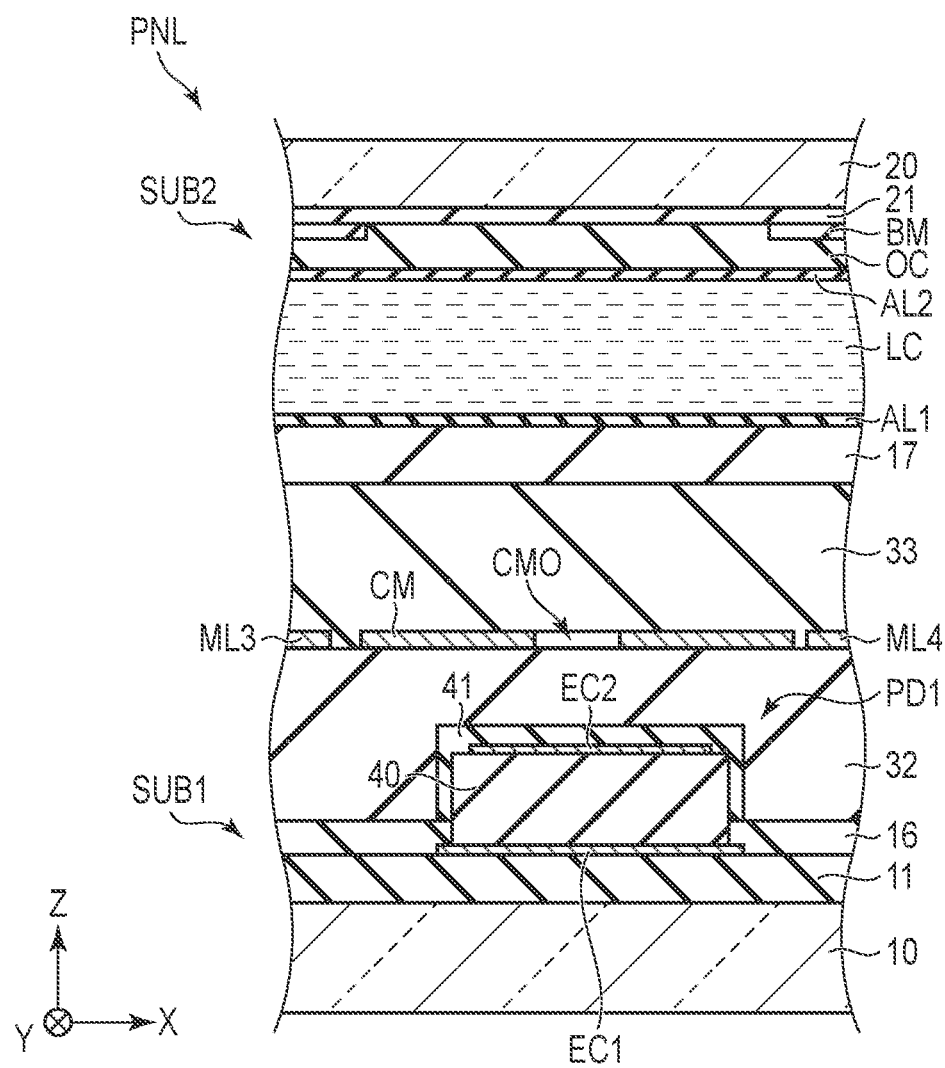
FIG. 13 is a cross-sectional view showing a display panel of the first modification example of the present embodiment.

FIG. 13 is a cross-sectional view showing a display panel PNL of the first modification example of the present embodiment.

As shown in FIG. 13, a display panel PNL of the first modification example is different from the display panel PNL shown in FIG. 9 in further comprising a light-shielding portion CM.

The light-shielding portion CM is located between the insulating layer 32 and the insulating layer 33 and overlaps the photoelectric conversion element PD1. The light-shielding portion CM has a through hole CMO overlapping the active layer 40. In the illustrated example, one through hole CMO is formed. However, a plurality of through holes CMO may be formed as will be described later. The light-shielding portion CM is formed of a metal material, and is formed of, for example, the same material as the metal line ML3 and the metal line ML4.

Figure 14:
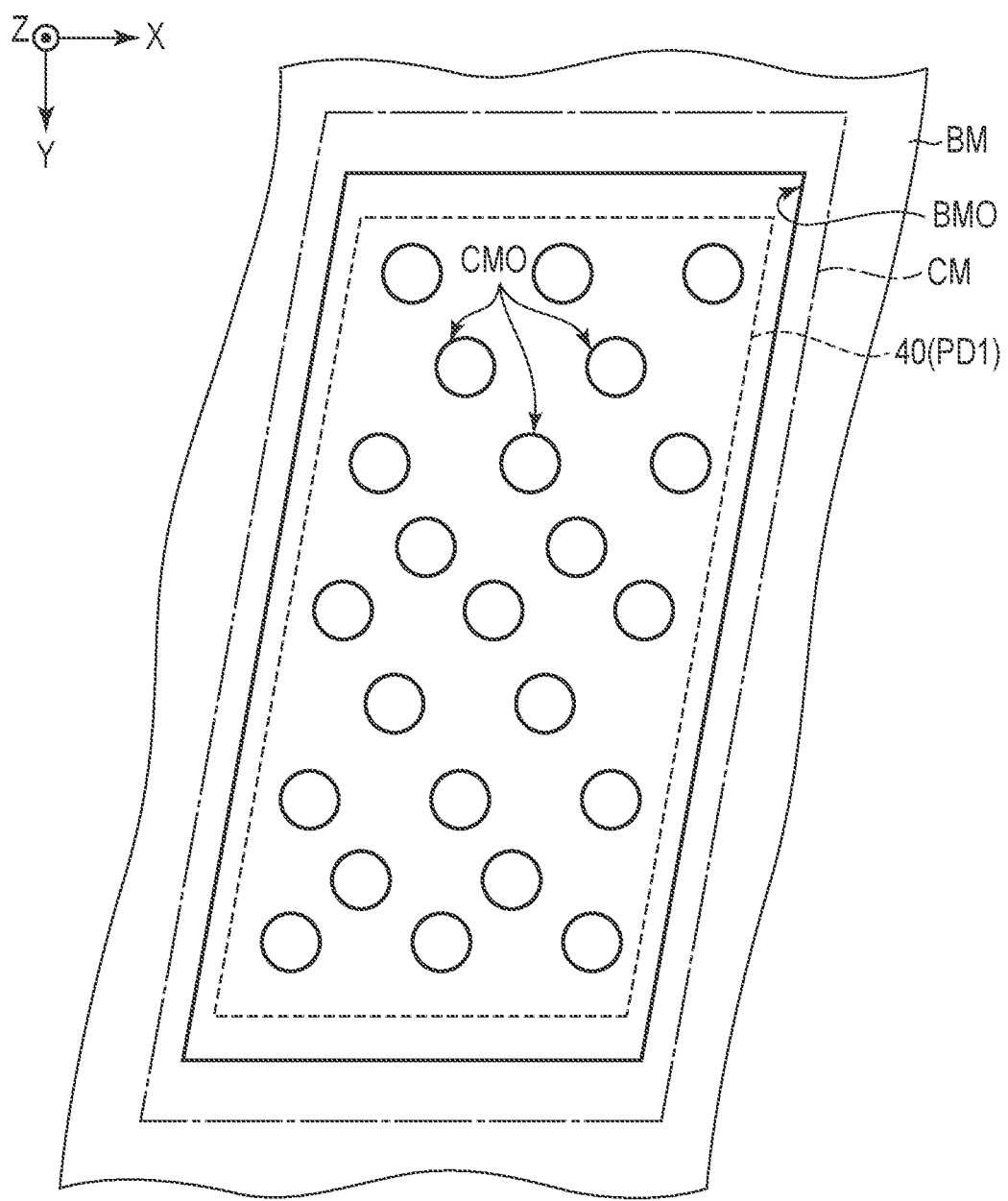
FIG. 14 is an illustration for explaining a light-shielding portion of FIG. 13, and is a plan view showing the light-shielding layer, the light-shielding portion and the photoelectric conversion element.

FIG. 14 is an illustration for explaining the light-shielding portion CM of FIG. 13, and is a plan view showing the light-shielding layer BM, the light-shielding portion CM and the photoelectric conversion element PD1. The light-shielding portion CM is shown by a dashed-dotted line, and the active layer 40 of the photoelectric conversion element PD1 is shown by a dashed line.

As shown in FIG. 14, the light-shielding portion CM covers the active layer 40 in planar view. The through holes CMO are disposed at positions overlapping the active layer 40 in planar view. The light-shielding portion CM can limit light traveling from the insulating layer 33 toward the photoelectric conversion element PD1. The light-shielding portion CM can suppress the traveling to the photoelectric conversion element PD1 of light transmitted through the colored layer of the pixel PX close to the photoelectric conversion element PD1, for example.

Figure 15:
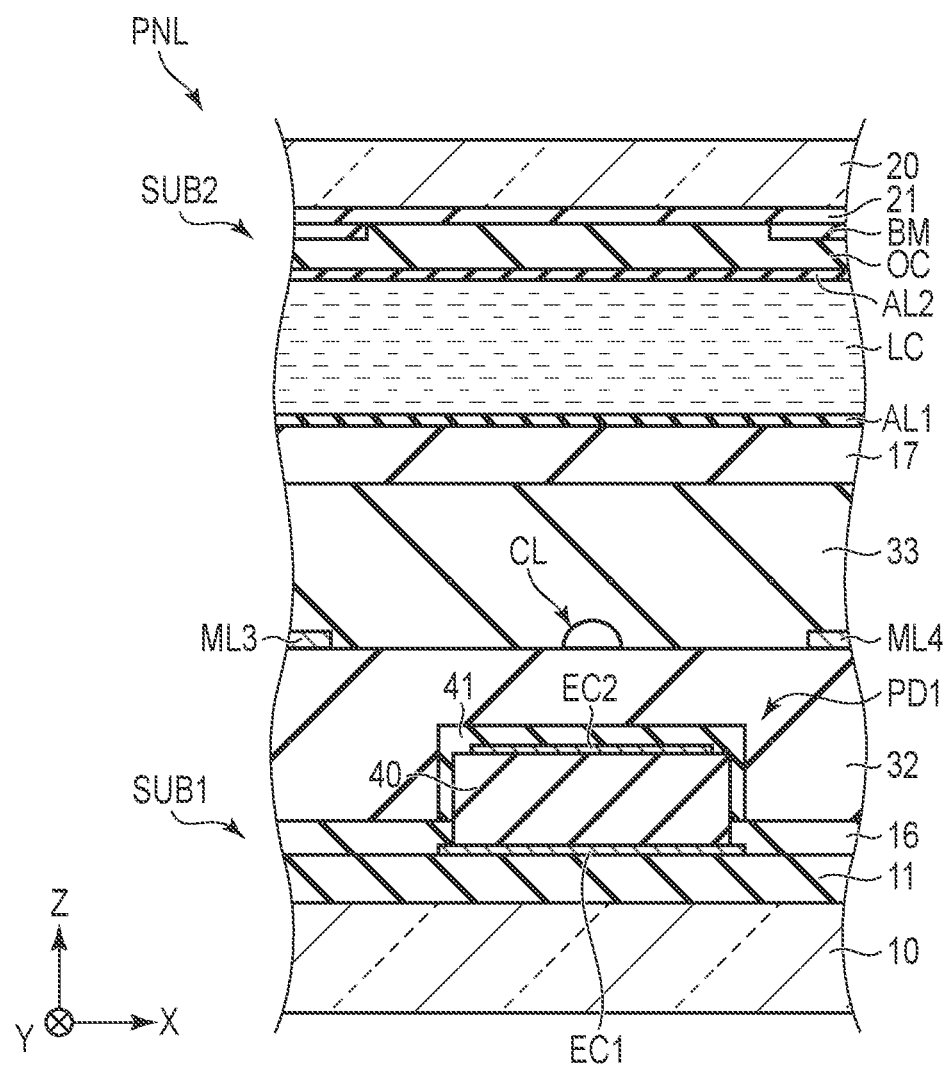
FIG. 15 is a cross-sectional view showing a display panel of the second modification example of the present embodiment.

FIG. 15 is a cross-sectional view showing a display panel PNL of the second modification example of the present embodiment.

As shown in FIG. 15, a display panel PNL of the second modification example is different from the display panel PNL shown in FIG. 9 in having a condensing portion CL.

The condensing portion CL is a portion protruding in a direction from the insulating layer 32 to the insulating layer 33. The condensing portion CL overlaps the active layer 40 of the photoelectric conversion element PD1. In the illustrated example, the condensing portion CL is an optical lens formed in a hemispherical shape. The condensing portion CL is formed of, for example, a resin material such as polyimide or a material having a refractive index greater than the refractive index of the insulating layer 33. The condensing portion CL can collect light traveling from the insulating layer 33 toward the active layer 40 toward the photoelectric conversion element PD1. In the illustrated example, one condensing portion CL is disposed. However, a plurality of condensing portions CL may be disposed.

Figure 16:
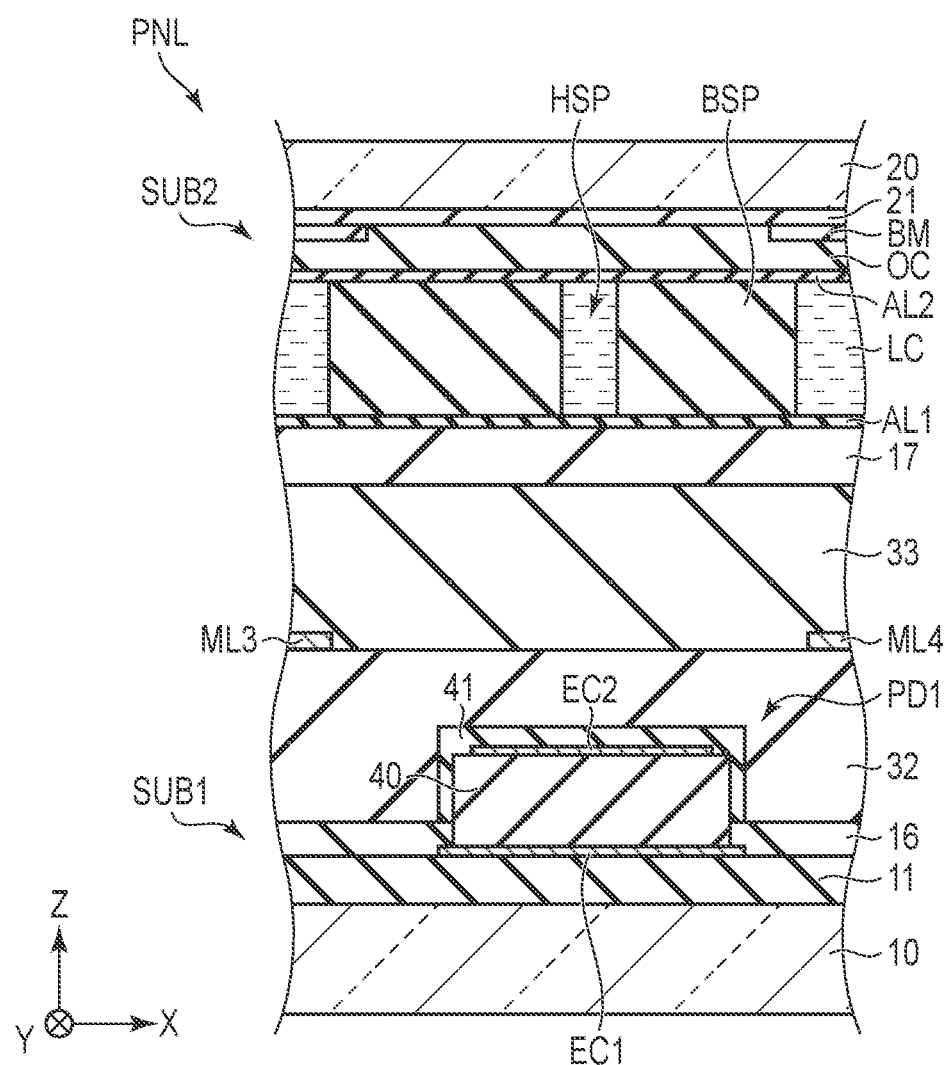
FIG. 16 is a cross-sectional view showing a display panel of the third modification example of the present embodiment.

FIG. 16 is a cross-sectional view showing a display panel PNL of the third modification example of the present embodiment.

As shown in FIG. 16, a display panel PNL of the third modification example is different from the display panel PNL shown in FIG. 9 in comprising a spacer BSP overlapping the photoelectric conversion element PD1.

The spacer BSP is located between the first substrate SUB1 and the second substrate SUB2, and has a through hole HSP overlapping the photoelectric conversion element PD1 in the third direction Z. The spacer BSP is in contact with each of the alignment film AL1 and the alignment film AL2. In the illustrated example, the spacer BSP has one through hole HSP. However, it may have a plurality of through holes HSP. The spacer BSP is formed of a resin material, and is formed of, for example, the same material as the main spacer MSP and the sub-spacer SSP. The spacer BSP is formed of, for example, black resin. The spacer BSP can limit light traveling from the second substrate SUB2 toward the photoelectric conversion element PD1. The spacer BSP can suppress the traveling to the photoelectric conversion element PD1 of light transmitted through the colored layer of the pixel PX close to the photoelectric conversion element PD1, for example.

Figure 17:
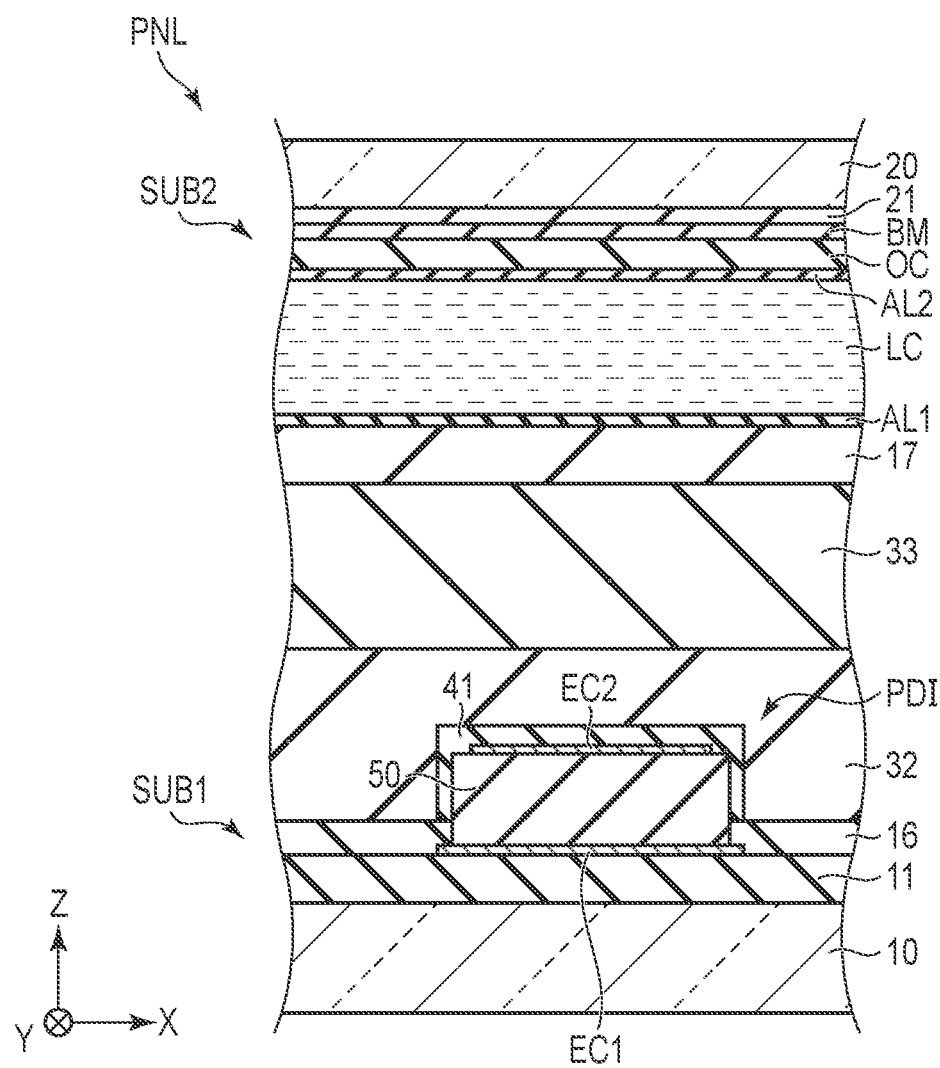
FIG. 17 is a cross-sectional view showing a display panel of the fourth modification example of the present embodiment.

FIG. 17 is a cross-sectional view showing a display panel PNL of the fourth modification example of the present embodiment.

As shown in FIG. 17, a display panel PNL of the fourth modification example is different from the display panel PNL shown in FIG. 9 in comprising a photoelectric conversion element PDI.

The photoelectric conversion element PDI is, for example, a PIN-type photodiode using indium gallium arsenide as an active layer 50. The photoelectric conversion element PDI can detect infrared light and can authenticate a vein pattern, for example. In the illustrated example, the photoelectric conversion element PD1 is located directly below the light-shielding layer BM. An illustration device IL may comprise a light-emitting element for the photoelectric conversion element PDI. An example of this light-emitting element is a light source which emits infrared light toward an object to be detected.

Figure 18:
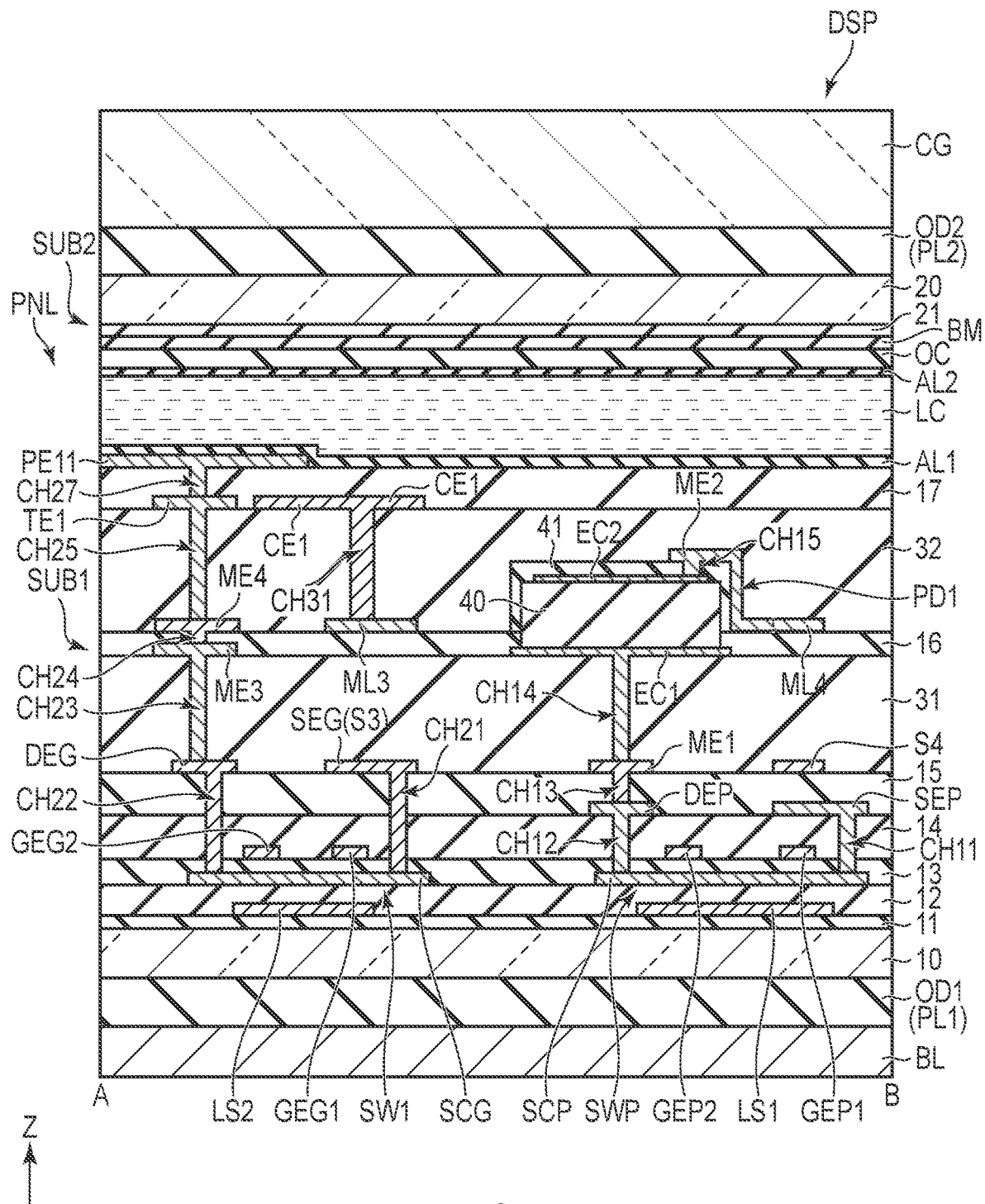
FIG. 18 is a cross-sectional view showing a display device of the fifth modification example of the present embodiment.

FIG. 18 is a cross-sectional view showing a display device DSP of the fifth modification example of the present embodiment.

As shown in FIG. 18, a display device DSP of the fifth modification example is different from the display device DSP shown in FIG. 8 in that the first substrate SUB1 is composed without the insulating layer 33 and the connection electrode ME5. The metal line ML3 and the metal line ML4 are located between the insulating layer 16 and the insulating layer 32. In the fifth modification example, the metal line ML3 and the metal line ML4 are formed simultaneously with and formed of the same material as the connection electrode ME4 and the connection electrode ME2. In addition, the connection electrode ME2 extends to the metal line ML4 and is integrally formed with the metal line ML4.

The contact hole CH26 and the contact hole CH31 are formed in the insulating layer 32. The transparent electrode TE1 and the common electrode CE1 are located on the insulating layer 32. The insulating layer 17 is formed on the insulating layer 32, the transparent electrode TE1 and the common electrode CE1, and covers the transparent electrode TE1 and the common electrode CE1. The transparent electrode TE1 is in contact with the connection electrode ME4.

According to the fifth modification example, the first substrate SUB1 can be formed without the insulating layer 33, and therefore the first substrate SUB1 (the display panel PNL) can be made thinner. In addition, since the insulating layer 33 does not have to be formed and the metal line ML3 and the metal line ML4 can be formed simultaneously with the connection electrode ME4 and the connection electrode ME2, it is possible to contribute to the shortening of the manufacturing time and the saving of the manufacturing cost.

As described above, according to the present embodiment, a substrate and a display device which can specify the position of an approaching or contacting object and detect light at the specified position can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate; and
a second substrate opposed to the first substrate;
the first substrate comprising:
   a first switching element and a second switching element;
   a first organic insulating layer located above the first switching element and the second switching element;
   a third organic insulating layer located above the first organic insulating layer;
   a second organic insulating layer located between the first organic insulating layer and the third organic insulating layer;
   a first connection electrode located between the first organic insulating layer and the second organic insulating layer and electrically connected to the first switching element;
   a second connection electrode located between the second organic insulating layer and the third organic insulating layer and electrically connected to the first connection electrode;
   a pixel electrode located above the third organic insulating layer and electrically connected to the second connection electrode;
   a photoelectric conversion element located between the first organic insulating layer and the second organic insulating layer and electrically connected to the second switching element;
   a common electrode located above the third organic insulating layer; and
   a metal line located between the second organic insulating layer and the third organic insulating layer and electrically connected to the photoelectric conversion element.

2. The display device of claim 1, wherein the metal line is formed of a same material as the second connection electrode.

3. The display device of claim 1, wherein the first substrate further comprises a condensing portion overlapping the photoelectric conversion element, located between the second organic insulating layer and the third organic insulating layer, and protruding from the second organic insulating layer toward the third organic insulating layer.

4. The display device of claim 1, further comprising a spacer located between the first substrate and the second substrate, having a through hole overlapping the photoelectric conversion element, and limiting light traveling from the second substrate toward the photoelectric conversion element.

5. The display device of claim 1, wherein
the first substrate further comprises a light-shielding portion located between the second organic insulating layer and the third organic insulating layer, having a through hole overlapping the photoelectric conversion element, and limiting light traveling from the third organic insulating layer toward the photoelectric conversion element.

6. The display device of claim 5, wherein the light-shielding portion is formed of a same material as the metal line.

7. A display device comprising:
a first substrate; and
a second substrate opposed to the first substrate;
the first substrate comprising:
   a first switching element and a second switching element;
   a first organic insulating layer located above the first switching element and the second switching element;
   a third organic insulating layer located above the first organic insulating layer;
   a second organic insulating layer located between the first organic insulating layer and the third organic insulating layer;
   a first connection electrode located between the first organic insulating layer and the second organic insulating layer and electrically connected to the first switching element;
   a second connection electrode located between the second organic insulating layer and the third organic insulating layer and electrically connected to the first connection electrode;
   a pixel electrode located above the third organic insulating layer and electrically connected to the second connection electrode; and
   a photoelectric conversion element located between the first organic insulating layer and the second organic insulating layer and electrically connected to the second switching element,
the photoelectric conversion element being configured to detect infrared light,
the second substrate comprising:
   an insulating layer;
   an overcoat layer located closer to the first substrate than the insulating layer; and
   a light-shielding layer located between the insulating layer and the overcoat layer, the photoelectric conversion element being located directly below the light-shielding layer.

8. A display device comprising:

a first substrate;

a second substrate opposed to the first substrate; and an integrated circuit, the first substrate comprising:
- a first switching element and a second switching element;
- a first organic insulating layer located above the first switching element and the second switching element;
- a third organic insulating layer located above the first organic insulating layer;
- a second organic insulating layer located between the first organic insulating layer and the third organic insulating layer;
- a first connection electrode located between the first organic insulating layer and the second organic insulating layer and electrically connected to the first switching element;
- a second connection electrode located between the second organic insulating layer and the third organic insulating layer and electrically connected to the first connection electrode;
- a pixel electrode located above the third organic insulating layer and electrically connected to the second connection electrode;
- a photoelectric conversion element located between the first organic insulating layer and the second organic insulating layer and electrically connected to the second switching element;
- a first wiring line connected to the first switching element;
- a second wiring line connected to the second switching element;
- a first driving circuit connected to the first wiring line; and
- a second driving circuit connected to the second wiring line, the integrated circuit being connected to each of the first driving circuit and the second driving circuit.

* * * * *